(12) United States Patent
Izumi et al.

(10) Patent No.: US 6,798,030 B1
(45) Date of Patent: Sep. 28, 2004

(54) TWO-DIMENSIONAL IMAGE DETECTING DEVICE AND MANUFACTURING METHOD THEREOF

(75) Inventors: Yoshihiro Izumi, Kashihara (JP); Osamu Teranuma, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/459,641

(22) Filed: Dec. 13, 1999

(30) Foreign Application Priority Data

Dec. 14, 1998 (JP) ............................................ 10-355119
Sep. 6, 1999 (JP) ............................................ 11-252227

(51) Int. Cl.⁷ .......................... H01L 31/00; H01L 21/00
(52) U.S. Cl. ....................... 257/428; 257/443; 257/444; 257/448; 438/57
(58) Field of Search ................................ 257/428, 443, 257/444, 448; 438/57

(56) References Cited

U.S. PATENT DOCUMENTS

| | | | |
|---|---|---|---|
| 4,054,938 A | * 10/1977 | Morris, Sr. .................. | 361/764 |
| 4,865,245 A | * 9/1989 | Schulte et al. .............. | 228/116 |
| 5,319,206 A | 6/1994 | Lee et al. | |
| 5,379,336 A | 1/1995 | Kramer et al. | |
| 5,420,452 A | * 5/1995 | Tran et al. ..................... | 257/428 |
| 5,523,628 A | * 6/1996 | Williams et al. ............. | 257/777 |
| 5,812,191 A | * 9/1998 | Orava et al. ................. | 348/308 |
| 6,342,700 B1 | * 1/2002 | Izumi et al. ........... | 250/370.13 |

FOREIGN PATENT DOCUMENTS

| | | |
|---|---|---|
| EP | 0 523 783 A1 | 1/1993 |
| EP | 0 602 475 A2 | 6/1994 |
| EP | 0 783 177 A1 | 7/1997 |
| JP | 5-72724 A | 3/1993 |
| JP | 5-173320 A | 7/1993 |
| JP | 6-342098 A | 12/1994 |

OTHER PUBLICATIONS

Lee et al, "A New Digital Detector for Projection Radiography", SPIE, vol. 2432, Jul. 1995, pp. 237–249.

Jeromin et al, "8.4: Application of a–Si Active–Matrix Technology in a X–Ray Detector Panle", SID 97 Digest, 1997, pp. 91–94.

Fujikura et al, "Design of Cushion Layer which Enables "TRANSFER" System to Laminate with High Speed", IDW '98, Proceedings of the Fifth International Display Workshops, Dec. 7–9, 1998, International Conference Center Kobe, Kobe, Japan, pp. 315–318.

Hunt et al, "Detective Quantum Efficiency of Direct, Flat Panel X–ray Imaging Detectors for Fluoroscopy", SPIE, vol. 3336, Medical Imaging 1998, Physics of Medical Imaging, Feb. 1998, pp. 408–417.

(List continued on next page.)

*Primary Examiner*—M. Wilczewski
(74) *Attorney, Agent, or Firm*—Nixon & Vanderhye P.C.

(57) ABSTRACT

In a two-dimensional image detecting device, an active-matrix substrate and an opposing substrate are bonded to each other via conductive connecting members and space keeping members, that are disposed respectively for pixels, such that pixel electrodes and electrical charge collecting electrodes oppose each other. The pixel electrodes are formed on the active-matrix substrate, and the electrical charge collecting electrodes are formed on the opposing substrate. Further, when a resin material of the space keeping members is soft, reinforcing members, which have electrical insulation and are hardly deformed in a thermo-compression bonding, are dispersed into the resin material, so that the space keeping ability is fully exhibited. According to this arrangement, it is possible to improve the responsivity so as to respond to a moving image. Additionally, an even space can be achieved between the substrates, and it is possible to prevent a connecting defect and a defect caused by a leak between the substrates.

65 Claims, 16 Drawing Sheets

OTHER PUBLICATIONS

Kinno et al, "Development of a Large Area Direct Conversion X-ray Image Dectector", IDW '98, 1998, pp. 159–162.

den Boer et al, 25.1: Similarities Between TFT Arrays for Direct-Conversion X-Ray Sensors and High-Aperture AMLCDs, SID 98 Digest, 1998, pp. 371–374.

USSN 09/229,269, filed Jan. 13, 1999, entitled "Two-Dimensional Image Detector and Process for Manufacturing the Same".

USSN 09/239,855, filed Jan. 29, 1999, entitled "Two-Dimensional Image Detecting Device and Manufacturing Method Thereof".

USSN 09/437,470, filed Nov. 10, 1999, entitled "Two-Dimensional Image Detecting Device and Manufacturing Method Thereof".

* cited by examiner (Cs ELECTRODES 10 ARE OMITTED)

ΔH=H2−H1

PATTERN FORMATION OF CONDUCTIVE CONNECTING
MEMBERS AND SPACE KEEPING MEMBERS ON THE SUBSTRATES

SUBSTRATES ARE OPPOSED TO EACH OTHER AND ALIGNED

SUBSTRATES ARE BONDED TO EACH OTHER
BY THERMOCOMPRESSION BONDING

PATTERN FORMATION OF CONDUCTIVE CONNECTING MEMBERS $\Delta H = H2 - H1$

SUBSTRATES ARE OPPOSED TO EACH OTHER AND ALIGNED

SUBSTRATES ARE BONDED TO EACH OTHER BY THERMOCOMPRESSION BONDING

FIG.11 (a) TRANFER STEP
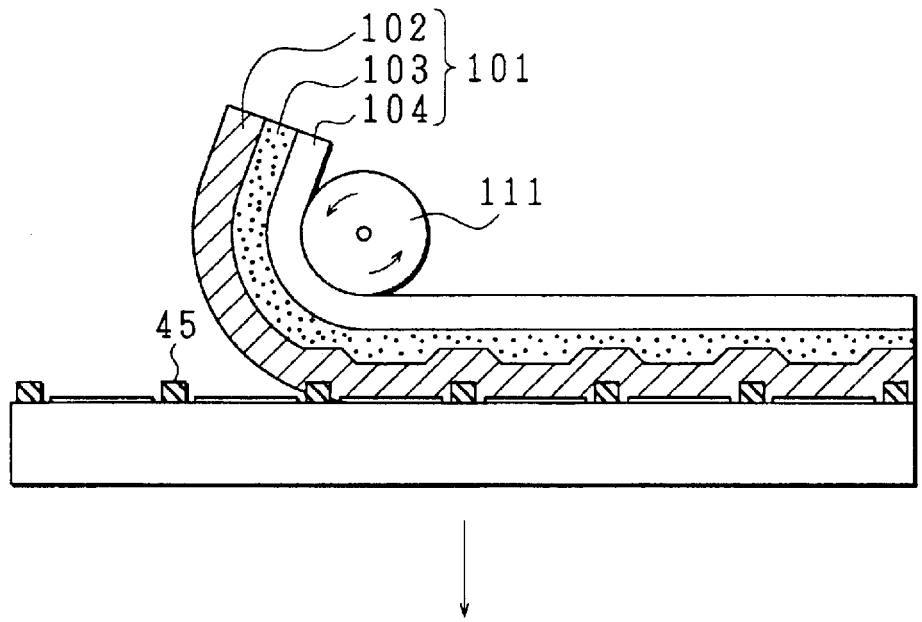
FIG.11 (b) REMOVAL OF SUPPORTING FILM
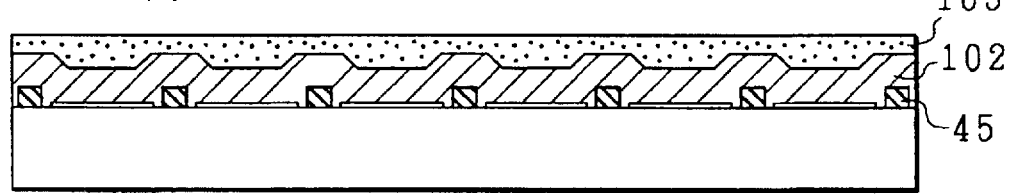
FIG.11 (c) PHOTOLITHOGRAPHY (DEVELOPING AND EXPOSING) STEP
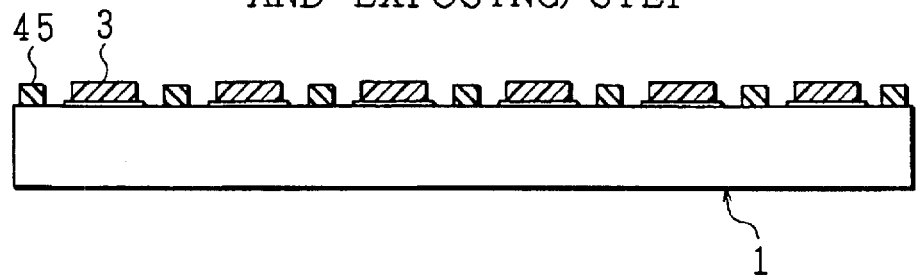

(Cs ELECTRODES 10 ARE OMITTED)

TWO-DIMENSIONAL IMAGE DETECTING DEVICE AND MANUFACTURING METHOD THEREOF

FIELD OF THE INVENTION

The present invention relates to a two-dimensional image detecting device which can detect an image of radiation such as an X-ray, a visible ray, or an infrared ray, and further concerns a manufacturing method thereof.

BACKGROUND OF THE INVENTION

Conventionally, a two-dimensional image detecting device for radiation has been known in which semiconductor sensors for detecting an X-ray and for generating electrical charge (electron-hole pair) are two-dimensionally disposed, each sensor is provided with an electrical switch, and the electrical switches are successively turned on for each raw so as to read electrical charge for each column of the sensor.

A specific structure and principle of such a two-dimensional image detecting device are described in "D. L. Lee, et al., 'A New Digital Detector for Projection Radiography', Proc. SPIE, Vol. 2432, Physics of Medical Imaging, pp. 237–249, 1995 (published on Feb. 26, 1995)", "L. S. Jeromin, et al., 'Application of a-Si Active-Matrix Technology in a X-Ray Detector Panel', SID(Society for Information Display) International Symposium, Digest of Technical Papers, pp. 91–94, 1997 (published on May 13, 1997)", and Japanese Laid-Open Patent Publication No.342098/1994 (Tokukaihei 6-342098, published on Dec. 13, 1994).

Referring to FIGS. 15 and 16, the following explanation describes the specific structure and principle of the conventional two-dimensional image detecting device for radiation. FIG. 15 is a perspective view schematically showing the construction of the two-dimensional image detecting device for radiation. Further, FIG. 16 is a sectional drawing schematically showing a structure for one pixel.

As shown in FIGS. 15 and 16, the two-dimensional image detecting device for radiation is provided with an active-matrix substrate 50 having electrode wires(gate electrode 52 and source electrode 53), a TFT(thin film transistor)54 and a storage capacitor(Cs)55, in an XY matrix form on a glass substrate 51. Moreover, a photoconductive film 56, a dielectric layer 57, and an upper electrode 58 are formed on virtually the entire surface of the active-matrix substrate 50.

The storage capacitor 55 has a construction in which a Cs electrode 59 opposes a pixel electrode 60 connected with a drain electrode of the TFT 54 via an insulating film 61.

As for the photoconductive film 56, semiconductive materials are used so as to generate electrical charge by exposure to radiation such as an X-ray. According to the aforementioned literatures, amorphous selenium(a-Se), which has high dark resistance and favorable photoconductivity, has been used for the photoconductive film 56. The photoconductive film 56 is formed with a thickness of 300–600 $\mu$m by using a vacuum evaporation method.

Further, an active-matrix substrate, which is formed in a manufacturing process of a liquid crystal display device, can be applied to the active-matrix substrate 50. For example, an active-matrix substrate used for an active matrix liquid crystal display device(AMLCD) is provided with the TFT made of amorphous silicon(a-Si) or poly-silicon(P-Si), an XY matrix electrode, and a storage capacitor. Therefore, only a few changes in the arrangement make it easy to use the active-matrix substrate 50 for the two-dimensional image detecting device for radiation.

Referring to FIGS. 15 and 16, the following explanation describes a principle of operations of the two-dimensional image detecting device for radiation having the above-mentioned structure. Electrical charge is generated when the photoconductive film 56 is exposed to radiation. The photoconductive film 56 and the storage capacitor 55 are electrically connected in series with each other; thus, when voltage is applied between the upper electrode 58 and the Cs electrode 59, electrical charge generated in the photoconductive film 56 moves to a positive electrode side and a negative electrode side. As a result, the storage capacitor 55 stores electrical charge. Further, an electron blocking layer 62 made of a thin insulating layer is formed between the photoconductive film 56 and the storage capacitor 55. The electron blocking layer 62 acts as a blocking photodiode for preventing electrical charge from being injected from one side.

With the above-mentioned effect, the TFT 54 is turned on in response to input signals of gate electrode G1, G2, G3, . . . , and Gn so that the electrical charge stored in the storage capacitor 55 can be applied to the outside from source electrodes S1, S2, S3, . . . , and Sn. The gate electrodes 52 and source electrodes 53, the TFT 54, and the storage capacitor 55, etc. are all formed in a matrix form; therefore, it is possible to two-dimensionally obtain image information of an X-ray by scanning signals for each line inputted to gate electrodes G1, G2, G3, . . . , and Gn.

Additionally, when the photoconductive film 56 has photoconductivity for a visible ray and an infrared ray as well as for the radiation such as an X-ray, the above-mentioned two-dimensional image detecting device for radiation also acts as a two-dimensional image detecting device for detecting the visible ray and the infrared ray.

Incidentally, the conventional two-dimensional detecting device for radiation has used a-Se for the photoconductive film 56. Since the a-Se does not have sufficient responsivity to an X-ray, the storage capacitor 55 needs to be exposed to the X-ray for a long time to be fully charged, before reading information, and it takes a long time to return the photoconductive layer 56 to the initial state after X-ray irradiation is shielded.

Further, in order to reduce leakage current(dark current) and to provide a protection against high voltage, the dielectric layer 57 is provided between the upper electrode 58 and the photoconductive film 56 made of a-Se. However, it is necessary to add a step(sequence) for removing electrical charge remained in the dielectric layer 57 for each frame; thus, the above-mentioned two-dimensional image detecting device can be used only for photographing a static picture.

In response to this problem, in order to obtain image data corresponding to a moving image, it is necessary to use the photoconductive film 56 which is superior in responsivity and sensitivity to X-ray. As the photoconductive materials, CdTe and CdZnTe, whose effective atomic number is larger than that of Se, have been known. However, when CdTe or CdZnTe is adopted instead of a-Se as a material of the photoconductive film 56 of the two-dimensional image detecting device for radiation, the following problem arises:

In the case of the conventional a-Se, a vacuum evaporation method can be adopted as a film-forming method and a film can be formed at a normal temperature; thus, it has been easy to form a film on the active-matrix substrate 50. Meanwhile, in the case of CdTe and CdZnTe, film-forming methods such as an MBE(molecular beam epitaxy)method and an MOCVD(metal organic chemical vapor deposition) method have been known. Especially in view of forming a film on a large substrate, it is understood that the MOCVD method is appropriate. However, when a material such as CdTe and CdznTe is made into a film by using the MOCVD method, a high temperature of approximately 400° C. is required for forming a film.

Generally, in the TFT 54 which is formed on the active-matrix substrate 50, an a-Si film or a p-Si film is used as a semiconductive layer. The a-Si film and the p-Si film are formed at a film-forming temperature of 300–350° C. while hydrogen($H_2$) being added, in order to improve the semiconductive property. The TFT element formed in such a process has a heat-resistance temperature of approximately 300° C. If the TFT element is exposed at a temperature exceeding the heat-resistance temperature, hydrogen is released from the a-Si film and the p-Si film; consequently, the conductive property is degraded.

Therefore, in view of the film-forming temperature, it has been practically difficult to make a material such as CdTe and CdZnTe into a film on the active-matrix substrate 50 by using the MOCVD method.

SUMMARY OF THE INVENTION

The present invention is devised to solve the above-mentioned problem. The objective is to provide a two-dimensional image detecting device which has favorable responsivity and detect a moving image, and a manufacturing method thereof.

In order to achieve the above objective, the two-dimensional image detecting device of the present invention (hereinafter, referred to as the present image detecting device), in which a pixel substrate and an opposing substrate oppose each other, the pixel substrate having a pixel alignment layer including a plurality of pixels, the opposing substrate having a photoconductive layer for generating electrical charge in accordance with incident light, is provided with conductive connecting members which are disposed so as to correspond to the pixels of the pixel alignment layer and which electrically connect the pixel alignment layer and the photoconductive layer, and space keeping members for keeping a space between the substrates.

In the present image detecting device, the pixel substrate and the opposing substrate are disposed so as to oppose each other. The pixel alignment layer is provided on the pixel substrate, and the photoconductive layer is provided on the opposing substrate.

The photoconductive layer disposed on the opposing substrate is a thin film which generates electrical charge in response to incident light (radiation, etc.) and is made of, for example, a semiconductive film. Further, the photoconductive layer is disposed so as to oppose the pixel alignment layer of the pixel substrate.

The pixel alignment layer has a plurality of pixels for accumulating electrical charge transmitted from the outside. For example, an active-matrix substrate is available, in which switching elements having pixel electrodes are arranged in a lattice form. Moreover, the pixels of the pixel alignment layer are connected with the photoconductive layer via the conductive connecting members.

In the present image detecting device, voltage is applied between the pixel alignment layer and the photoconductive layer, so that electrical charge appearing from the photoconductive layer in response to incident light is transmitted and accumulated into each of the pixels on the pixel alignment layer.

And then, pixels which accumulate electrical charge are identified so as to detect an image which enters the photoconductive layer.

Further, particularly, the present image detecting device has the pixel alignment layer and the photoconductive layer formed on the different substrates, so that the photoconductive layer is not formed on the pixel alignment layer. This arrangement can prevent a heating operation performed on the photoconductive layer from adversely affecting the pixel alignment layer.

Therefore, regarding the present image detecting device, it is possible to adopt a material which has high responsivity and sensitivity to incident light and requires a heating operation at a high temperature, as a material for the photoconductive layer. Hence, the responsivity can be improved upon detecting a two-dimensional image.

Furthermore, such a material (for example, a CdTe or CdZnTe compound semiconductor) can reduce voltage applied to the photoconductive layer, so that it is not necessary to provide a dielectric layer for protecting the photoconductive layer from high voltage. Hence, it is possible to eliminate the need for a process which removes electrical charge remaining on the dielectric layer. Consequently, continuous image detection, namely, moving image detection can be realized.

Further, the present image detecting device is provided with the space keeping members for keeping a space between the substrates. This arrangement can prevent a space (gap) between the substrates from becoming too small, upon bonding and connecting the substrates. Thus, it is possible to prevent damage on the conductive connecting members and a contact between the adjacent conductive connecting members (defect caused by leakage).

Moreover, in order to achieve the aforementioned objective, a manufacturing method of a two-dimensional image detecting device in accordance with the present invention (hereinafter, referred to as the present manufacturing method), the two-dimensional image detecting device including a pixel substrate which is provided with a pixel alignment layer having a plurality of pixels, and an opposing substrate which is provided with a photoconductive layer for generating electrical charge in response to incident light, the method including the steps of: a connecting member forming step for forming conductive connecting members on one of the substrates in accordance with the pixels of the pixel alignment layer; a keeping member forming step for forming space keeping members, which keep a space between the substrates, on one of the substrates; and a connecting step for bonding the substrates such that the pixel alignment layer and the photoconductive layer oppose each other.

The present manufacturing method is devised for manufacturing a two-dimensional image detecting device, in which the photoconductive layer and the pixel alignment layer are formed on the different substrates, like the present image detecting device. Namely, in the present manufacturing method, the photoconductive layer is not formed on the pixel alignment layer. Thus, it is possible to adopt a material which has high responsivity and sensitivity to incident light and requires a heating operation at a high temperature.

This method makes it possible to manufacture the two-dimensional image detecting device which can detect a moving image with high responsivity.

Furthermore, in the present manufacturing method, the pixel substrate and the opposing substrate are connected to each other via the conductive connecting members provided in accordance with the pixels of the pixel alignment layer.

This arrangement makes it possible to electrically connect the pixels and the photoconductive layer while securing electrical insulation between the pixels. Consequently, it is possible to manufacture the two-dimensional image detecting device which causes no crosstalk.

Additionally, in the present manufacturing method, the space keeping members are formed on one of the substrates before the substrates are bonded to each other. This arrangement makes it possible to prevent a space between the substrates from becoming too small in the connecting step. Therefore, it is possible to prevent damage on the conductive connecting members and a contact between the adjacent conductive connecting members.

Further, the space keeping members and the conductive connecting members are preferably formed by patterning the photosensitive resin, etc. Thus, it is possible to readily form the space keeping members and the conductive connecting members into desired shapes. Moreover, when the conductive connecting members are formed by patterning, it is possible to readily obtain electrical insulation between the pixels of the pixel alignment layer. Consequently, crosstalk can be prevented between the adjacent pixels.

Furthermore, the space keeping members are formed by patterning, so that the space keeping members and the conductive connecting members can be formed separately with ease. Therefore, it is possible to prevent deformation and property degradation of the conductive connecting members upon bonding the substrates.

For a fuller understanding of the nature and advantages of the invention, reference should be made to the ensuing detailed description taken in conjunction with the accompanying drawings.

BRIEF DESCRIPTION OF THE DRAWINGS

FIG. 6(a) shows a pattern formation of the conductive connecting members, FIG. 6(b) shows a pattern formation of the space keeping members, FIG. 6(c) shows alignment of the active-matrix substrate and an opposing substrate, and FIG. 6(d) shows a connection between the active-matrix substrate and the opposing substrate.

FIG. 7(a) shows the conductive connecting members and the space keeping members before bonding the substrates. FIG. 7(b) shows the conductive connecting members and the space keeping members after bonding the substrates.

FIG. 10(a) shows a pattern formation of the space keeping members, FIG. 10(b) shows a pattern formation of the conductive connecting members, FIG. 10(c) shows alignment of the active-matrix substrate and the opposing substrate, and FIG. 10(d) shows a connection between the active-matrix substrate and the opposing substrate.

FIGS. 11(a) through 11(c) are explanatory drawings showing the detail of the pattern formation of the conductive connecting members, that is shown in FIG. 10(b).

FIG. 11(a) shows that a photosensitive resin sheet is bonded to the active-matrix substrate, FIG. 11(b) shows that a supporting film is removed from the photosensitive resin sheet, and FIG. 11(c) shows a photolithography step performed on the photosensitive resin layer.

DESCRIPTION OF THE EMBODIMENTS

Comparative Example

A technology, which the present invention is based upon, is firstly discussed.

As a method for solving the aforementioned problem of a conventional two-dimensional image detecting device, a method has been known in which a photoconductive layer made of CdTe or CdZnTe is formed on another supporting substrate at high temperature of 300° C. or more, and then, the supporting substrate and an active-matrix substrate are bonded to each other at a low temperature of 300° C. or less.

Figure 13:
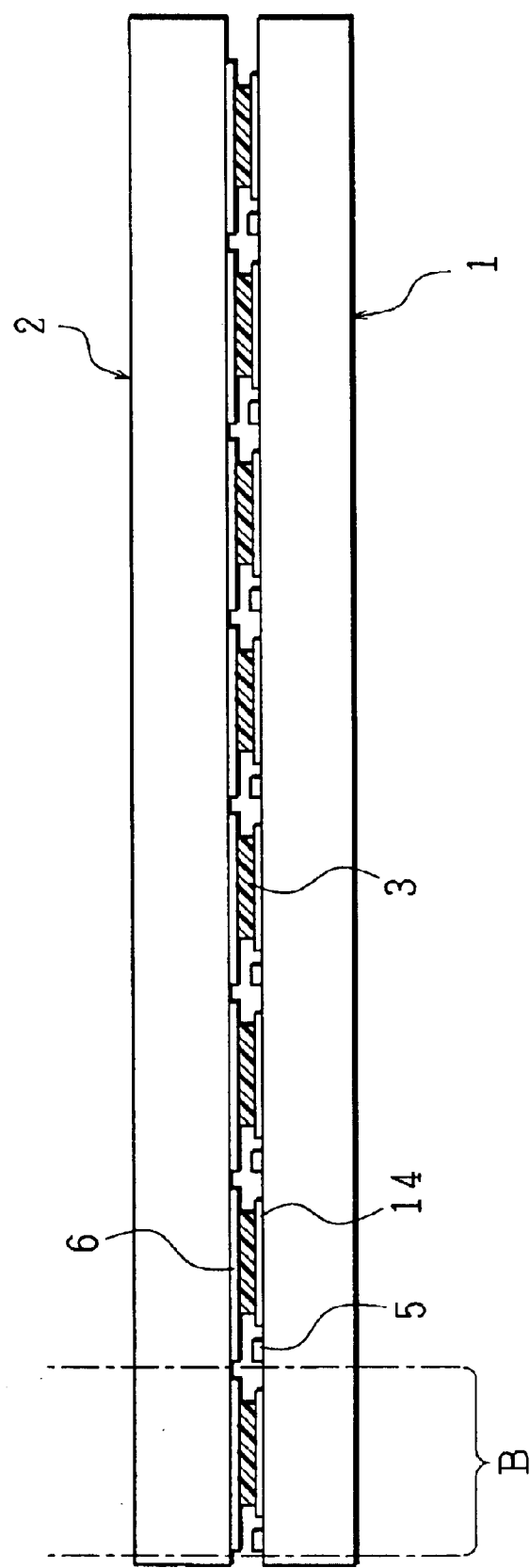
FIG. 13 is a sectional view schematically showing an entire construction of a two-dimensional image detecting device relating to a conventional art of the present invention.
Figure 14:
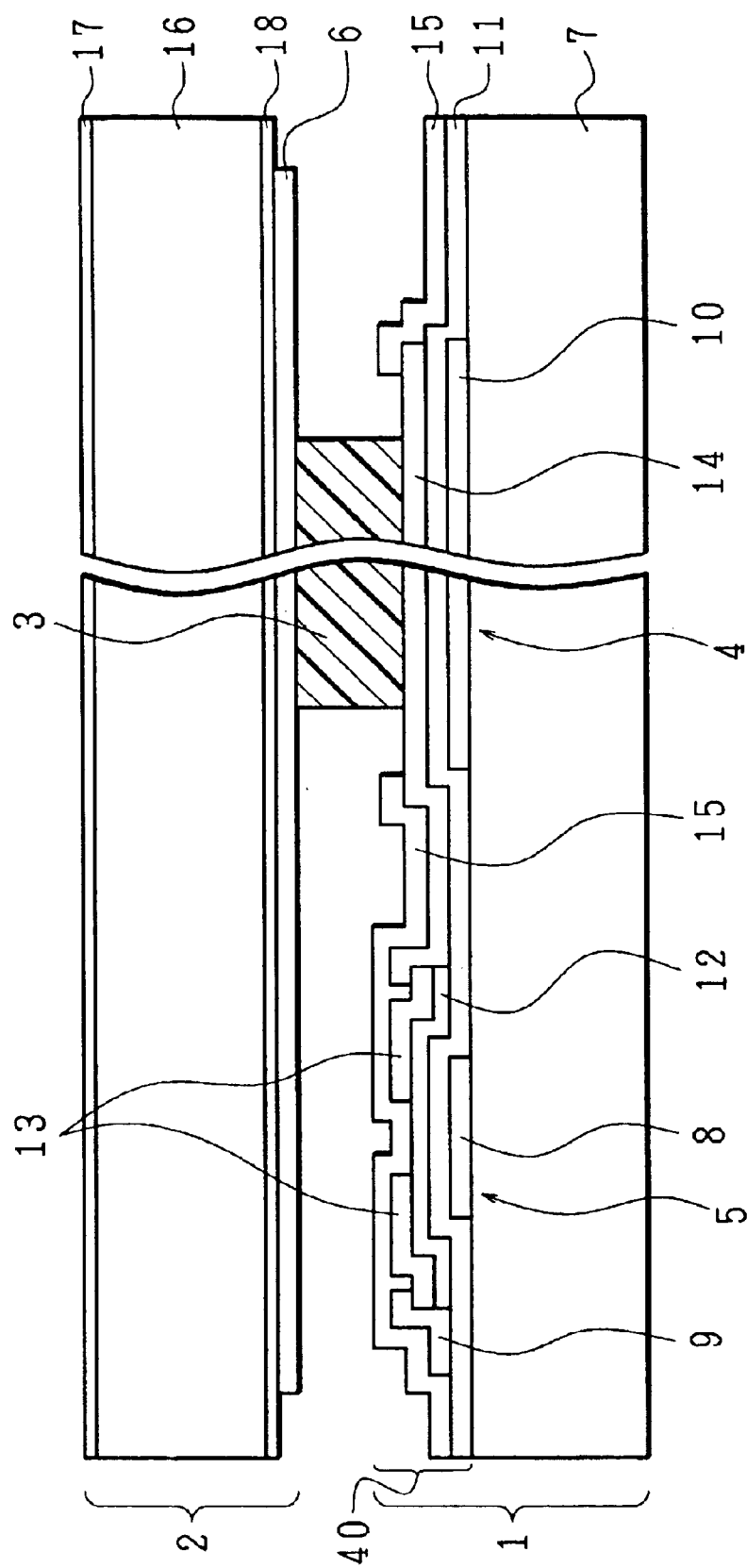
FIG. 14 is a sectional view showing a construction of one pixel (area B of FIG. 13) of the two-dimensional image detecting device shown in FIG. 13.

FIGS. 13 and 14 are sectional views showing a construction in which an active-matrix substrate and an opposing substrate are bonded to each other with a conductive connecting member provided for each pixel, the active-matrix substrate having XY matrix electrodes, TFTS, pixel electrodes, storage capacitors, and others, and the opposing substrate having an upper electrode, a semiconductive layer (photoconductive layer), a connecting electrode(charge collecting electrode), and others on the supporting substrate. FIG. 13 is an entire sectional view, and FIG. 14 is a detailed sectional view for one pixel(area B of FIG. 13).

The above-mentioned construction makes it possible to adopt a photoconductive layer made of CdTe or CdZn in the two-dimensional image detecting device, thereby photographing a moving image on a real time basis.

However, the above-mentioned two-dimensional image detecting device has a structural problem as follows:

In the two-dimensional image detecting device of FIGS. 13 and 14, the active-matrix substrate and the opposing substrate need to be bonded to each other while opposing each other. When the two-dimensional image detecting device has a large area, it is difficult to entirely bond the substrates with an even space(gap).

For this reason, for example, upon bonding the substrates, each having an area of approximately 400 mm×500 mm, a space partially becomes wide between the substrates, resulting in a connecting defect of the conductive connecting member. Further, when the substrates are bonded to each other with a large pressure in order to prevent the defect, a space partially becomes narrow between the substrates so as to press and deform the conductive connecting member thereon; consequently, the adjacent conductive connecting members are brought into contact with each other(defect caused by leakage).

[Embodiment 1]

The following description discusses a first embodiment of the present invention.

A two-dimensional image detecting device of the present embodiment(hereinafter, referred to as the present image detecting device) can solve the aforementioned problems of the conventional two-dimensional image detecting device. Further, upon bonding and connecting a large active-matrix substrate and a large opposing substrate, it is possible to make even a space (substrate gap) of the substrates and to prevent a connecting defect and leak from occurring between the substrates.

Firstly, the construction of the present image detecting device is discussed.

The present image detecting device has a construction in which semiconductor sensors are disposed in an XY matrix form(two-dimensional) for detecting radiation such as X-ray so as to generate and accumulate electrical charge. Further, electrical switches disposed on the sensors are successively turned on for every row, so that electrical charge of the sensors in the columns, whose electrical switches are turned on, is read successively(for every line)

Figure 1:
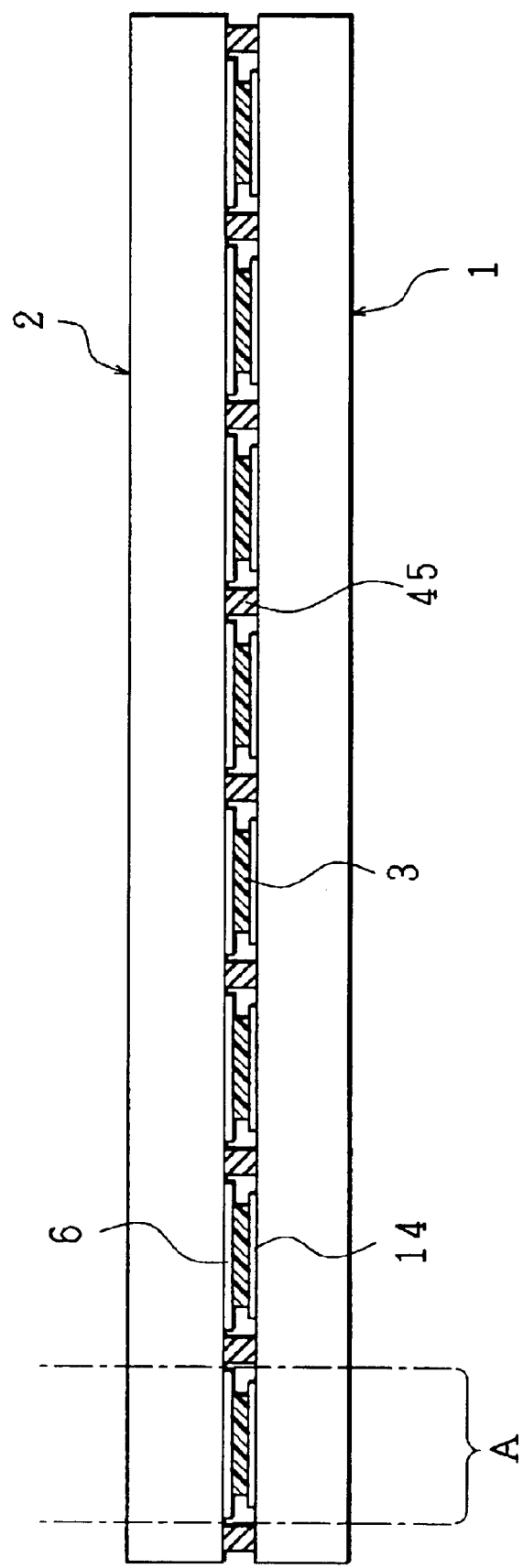
FIG. 1 is a sectional view schematically showing an entire construction of the two-dimensional image detecting device in accordance with a first embodiment of the present invention.

FIG. 1 is an entire sectional view of the present image detecting device. As shown in FIG. 1, the present image detecting device has a construction in which an active-matrix substrate having pixel electrodes 14 and an opposing substrate 2 having electrical charge collecting electrodes 6 are bonded to each other via conductive connecting members 3 and space keeping members 45.

The electrical charge collecting electrodes 6 and the pixel electrodes 14 are disposed so as to oppose each other. Further, the conductive connecting member 3 is disposed for each of the electrical charge collecting electrodes 6 and pixel electrodes 14 (for each pixel) so as to electrically connect the electrical charge collecting electrodes 6 and the pixel electrodes 14.

Figure 2:
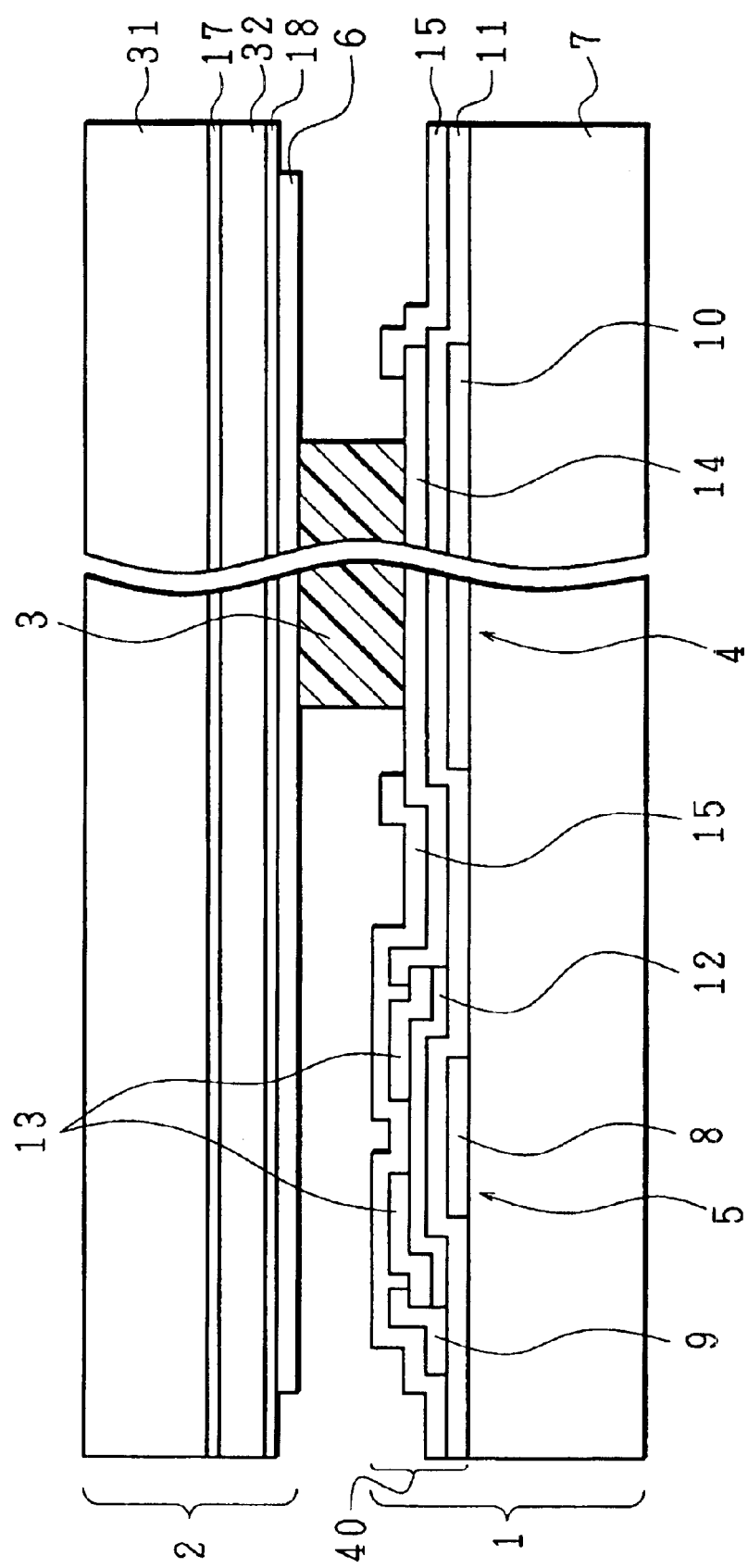
FIG. 2 is a sectional view showing a construction of one pixel (area A of FIG. 1) of the two-dimensional image detecting device of FIG. 1.

Here, the following explanation describes the constructions of the opposing substrate 2 and the active-matrix substrate 1. FIG. 2 is a sectional view showing the detail of an area A(area corresponding to one pixel of the present image detecting device) of FIG. 1. As shown in FIG. 2, in the opposing substrate 2, an upper electrode 17, a semiconductive layer 32, a carrier blocking layer 18, and an electrical charge collecting electrode 6 are stacked in this order on a glass substrate 31.

The glass substrate 31 is a supporting substrate of the opposing substrate 2 and is made of a material having transparency to radiation and a visible light.

The upper electrode 17 is a conductive film which is formed on the virtually entire surface of the glass substrate 31 and is made of a material such as ITO and Au. An ITO electrode, which transmits a visible light, is used as the upper electrode 17, so that the present image detecting device can detect a visible light as well as radiation.

The semiconductive layer 32 is made of a semiconductive material (CdTe, CdZnTe, etc.) having photoconductivity for generating electrical charge upon exposure to light such as radiation and a visible light. The electrical charge collecting electrode(connecting electrode)6 collects electrical charge generated in the semiconductive layer 32.

The carrier blocking layer 18 is made of a thin insulating layer and reduces the occurrence of dark current when no radiation is applied. Namely, the carrier blocking layer 18 has an MIS(Metal-Insulator-Semiconductor) structure and acts as a blocking photo diode for blocking the entry of electrical charge from one side.

Meanwhile, as shown in FIG. 2, the active-matrix substrate(pixel substrate)1 has a construction in which a pixel alignment layer 40 is formed on a glass substrate 7. Further, the pixel alignment layer 40 is provided with a storage capacitor 4, a TFT 5, electrode wires(gate electrode 8 and source electrode 9), and an insulating protection film 15.

The storage capacitor 4 stores electrical charge generated in the semiconductive layer 32 and serves as a pixel of the present image detecting device. Additionally, the storage capacitor 4 constitutes a semiconductor sensor, which detects radiation, generates and stores electrical charge, with the electrical charge collecting electrode 6, the semiconductive layer 32, and the conductive connecting member 3(described later).

Moreover, as shown in FIG. 2, the storage capacitor 4 has a construction in which a storage capacitor(Cs)electrode 10 and a pixel electrode 14 oppose each other via an insulating film 11. The insulating film 11 can also act as a gate insulating film or a storage capacitor(Cs). Further, the pixel electrode 14 can also act as a drain electrode of the TFT 5. Additionally, the insulating protection film 15 provides a insulating protection for areas other than openings on the pixel electrode 14.

Figure 3:
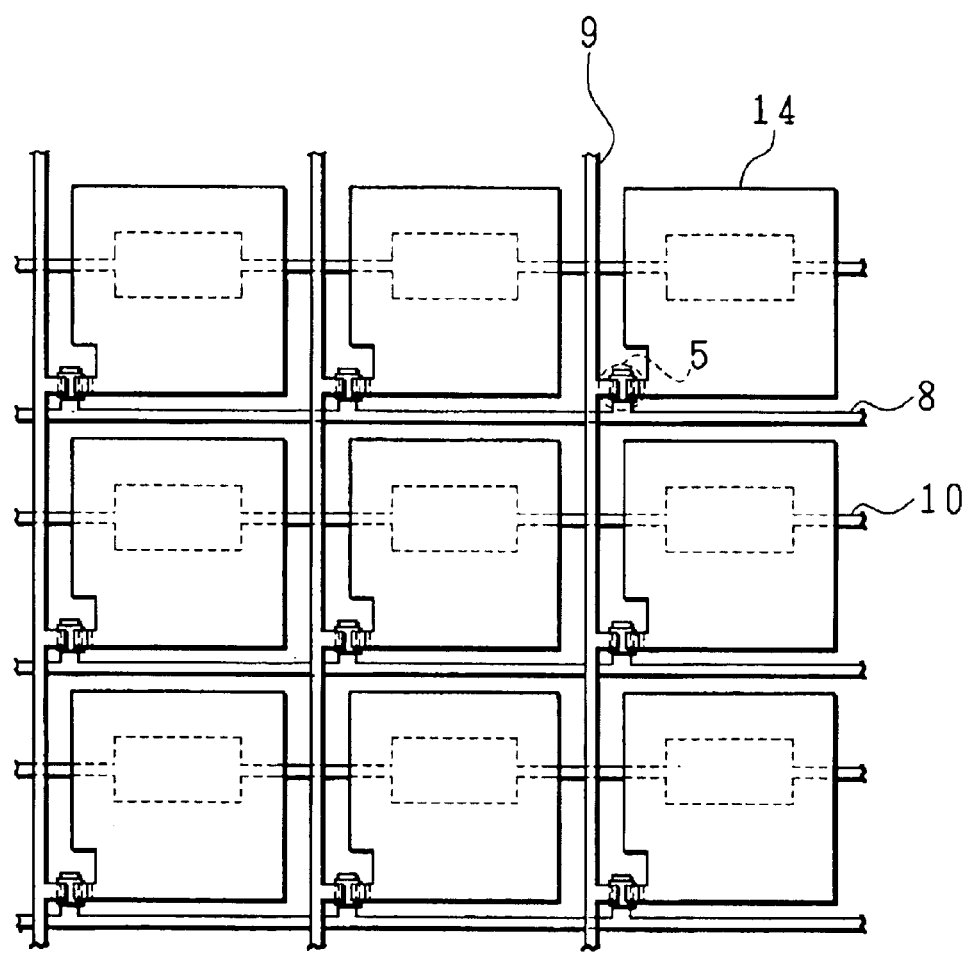
FIG. 3 is a plan view showing a wiring pattern example of electrodes formed on an active-matrix substrate of the two-dimensional image detecting device shown in FIG. 1.

FIG. 3 is a plan view showing an arrangement of the members on the active-matrix substrate 1. As shown in FIG. 3, the gate electrodes 9 and the source electrodes 8 are arranged in an XY matrix form(lattice form) on the active-matrix substrate 1. At each of the intersections of the electrodes 8 and 9, the TFT 5, the Cs electrode 10 constituting the storage capacitor 4, and the pixel electrode 14 are formed.

The TFTs(thin film transistor(switching element))5 are TFT elements, which use a-Si in an inverse stagger structure. And each of the TFTs is provided with an i-type a-Si film 12 serving as a channel section and an $n^+$-type a-Si film 13 for making contact between the source electrode 9 and the pixel electrode 14(drain electrode).

Further, the TFTs 5 can also act as electrical switches for retrieving electrical charge stored in the storage capacitors 4, and the TFTs 5 are connected with the source electrodes 9 and the gate electrodes 8.

The gate electrodes 8 are electrode wires which output a control signal for controlling the turning on/off of the TFTs 5. Moreover, the source electrodes 9 are electrode wires for retrieving electrical charge which is stored in the storage capacitors 4 connected with the TFTs, when the TFTs are turned on.

Figure 4:
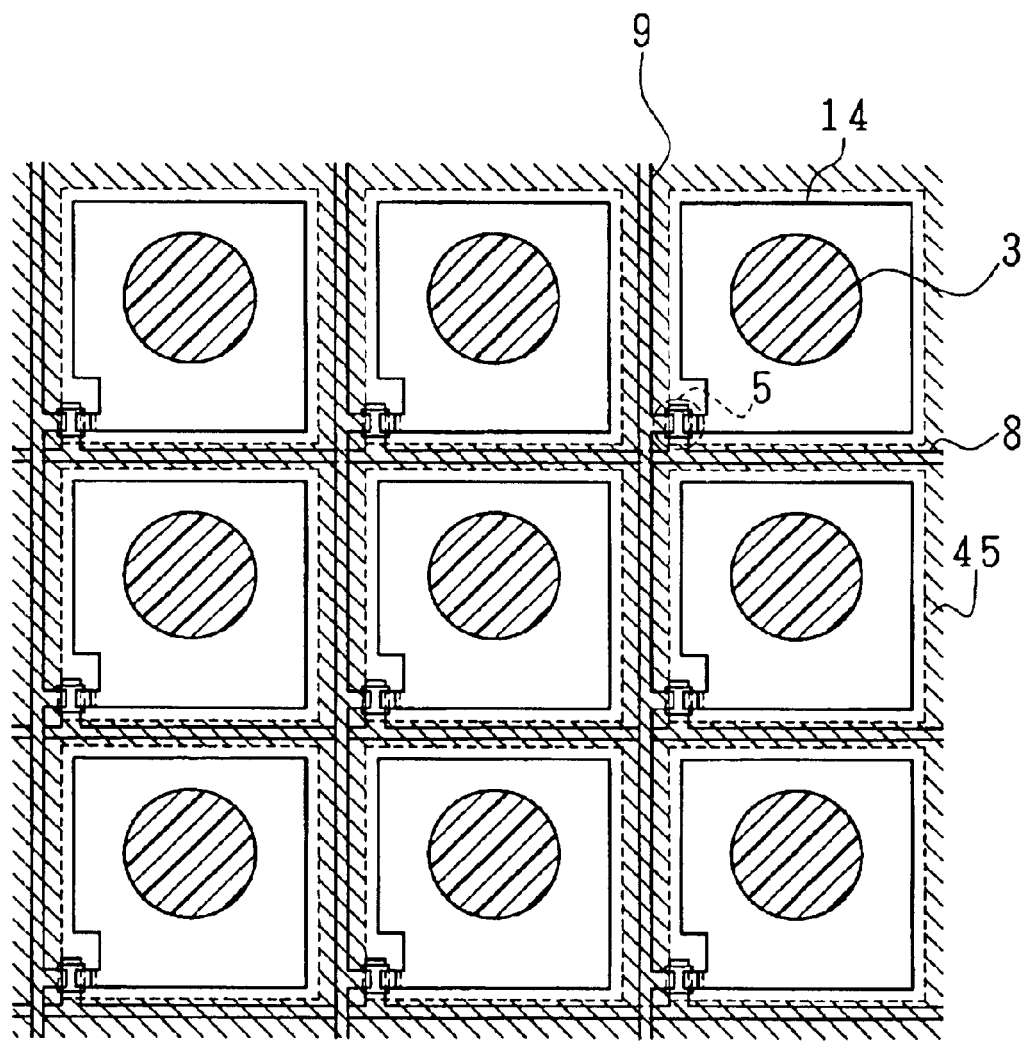
FIG. 4 is a plan view showing a positional relationship between conductive connecting members and space keeping members on the active-matrix substrate of the two-dimensional image detecting device shown in FIG. 1.

Next, the following explanation describes the arrangement of the conductive connecting members 3 and the space keeping members 45. FIG. 4 is a plan view showing the arrangement of the conductive connecting members 3 and the space keeping members 45 on the active-matrix substrate 1.

The conductive connecting members 3 are made of conductive materials having adhesion and are independently formed into island shapes on the pixel electrodes 14, as shown in FIG. 4. Further, as shown in FIG. 2, the conductive connecting members 3 are bonded to the pixel electrodes 14 and the electrical charge collecting electrodes 6 so as to obtain an electrical connection between the pixel electrodes 14 and the electrical charge collecting electrodes 6.

The conductive connecting members 3 can be made of a photosensitive resin which is conductive and is softened so as to be adhesive, or made of a conductive adhesive, etc. which is thermosetting or photo-curing.

The space keeping members 45 are made of a material which has electrical insulation and maintains an even space (gap between the substrates) between the active-matrix substrate 1 and the opposing substrate 2. As shown in FIG. 4, the space keeping members 45 are formed in an XY matrix form(lattice form) so as to surround the pixel electrodes 14. Namely, the space keeping members 45 are disposed between the adjacent conductive connecting members 3.

The space keeping members 45 preferably have a high hardness in order to favorably maintain a gap between the substrates 1 and 2. It is desirable to obtain a hardness which is at least higher than that of the conductive connecting members 3.

The space keeping members 45 with the above construction can be made of a photosensitive resin having electrical insulation, or a resin material with electrical insulation mixed with an reinforcing material or a filler that has electrical insulation.

Here, the following second Embodiment fully describes the material and the size of the conductive connecting member 3 and the space keeping member 45.

Moreover, the present image detecting device is provided with a high-voltage power supply (not shown) for applying a predetermined voltage between the Cs electrode 10 of the storage capacitor 4 and the upper electrode 17. Further, between the upper electrode 17 and the Cs electrode 10, the semiconductive layer 32, the carrier blocking layer 18, the conductive connecting member 3, and the storage capacitor 4 including the electrode 10 are formed in a cascade connection.

Figure 5:
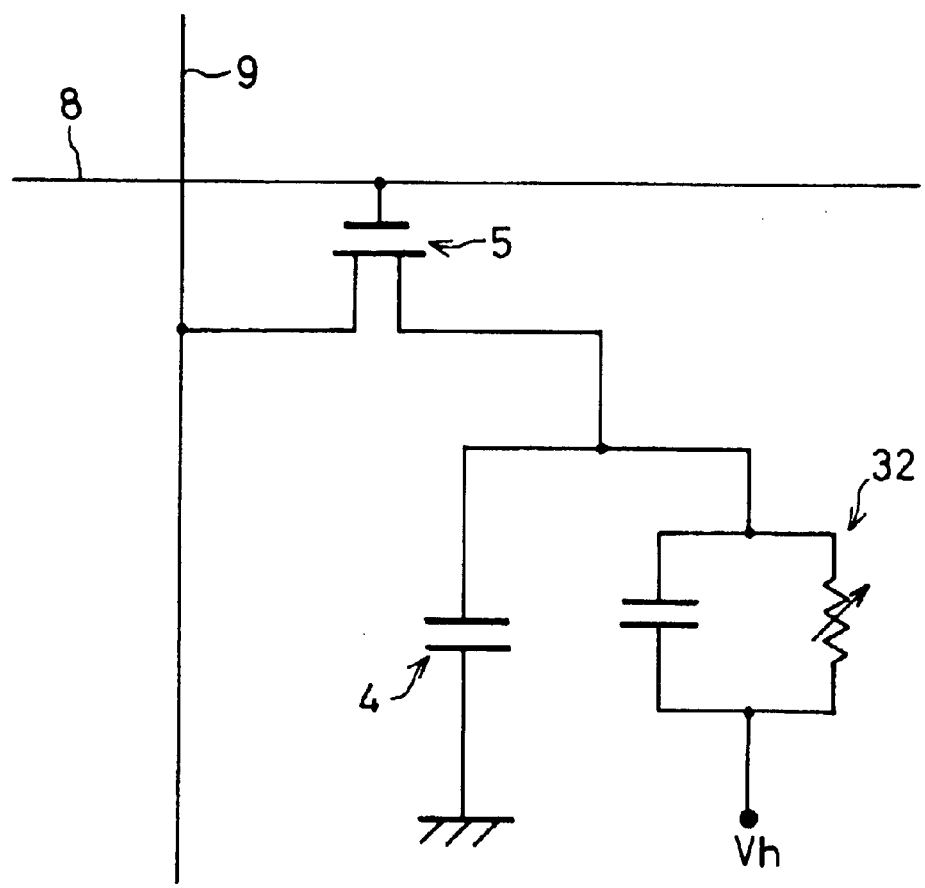
FIG. 5 is an equivalent circuit showing one pixel of the two-dimensional image detecting device of FIG. 1.

Here, referring to FIGS. 2, 3, and 5, the following explanation describes a principle of operations regarding the present image detecting device. Additionally, FIG. 5 is an explanatory drawing showing an equivalent circuit regarding one pixel of the present image detecting device.

When radiation is emitted on the present image detecting device, electrical charge(electron-hole pair) appears on the semiconductive layer 32 due to a photoconductive effect. The electrical charge generated in the semiconductive layer 32 moves to a positive electrode side and a negative electrode side in accordance with voltage applied between the upper electrode 17 and the Cs electrode 10. As a result, electrical charge is accumulated in the storage capacitor 4 which is cascaded with the semiconductive layer 32 via the conductive connecting member 3 and electrical charge collecting electrode 6.

Further, when the electrical charge accumulated in the storage capacitor 4 is taken to the outside, initially, a signal(ON signal) for turning on the TFT 5 is outputted from the gate electrode 8 to the TFT 5. And then, from the source electrodes 9 connected with a raw of the TFTs 5 which are turned on(connected with one of the gate electrodes 8), electrical charge is successively taken out.

Here, as shown in FIG. 3, the gate electrode 8, the source electrode 9, the TFT 5, and the storage capacitor 4 and others are all formed in an XY matrix form. Therefore, ON signals are successively outputted from the gate electrodes 8, and electrical charge is successively taken out from a line of the TFTs 5 which are turned on so as to obtain image information of radiation in a two-dimensional manner.

As described above, the present image detecting device is provided with the pixel alignment layer 40 and the semiconductive layer 32 respectively on the substrates 1 and 2, without forming the semiconductive layer 32 on the pixel alignment layer 40. This arrangement makes it possible to prevent a heating operation performed on the conductive layer 32 from affecting the pixel alignment layer 40.

Therefore, as for the present image detecting device, as a material of the semiconductive layer 32, it is possible to adopt a material(CdTe, CdZnTe compound semiconductor) which has high responsivity and sensitivity to incident light and requires a heating operation at a high temperature.

Furthermore, such a material can reduce voltage applied to the semiconductive layer 32, so that it is not necessary to provide a dielectric layer for protecting the semiconductive layer 32 from high voltage. For this reason, it is possible to eliminate a step for removing electrical charge remained in the dielectric layer so as to realize a continuous image detection, namely, a detection of a moving image.

Also, the present image detecting device is provided with the space keeping members 45 for maintaining a gap between the substrates 1 and 2. This arrangement makes it possible to maintain the gap between the substrates 1 and 2 even when external pressure is applied to the present image detecting device. Thus, it is possible to prevent a damage on the conductive connecting members 3 and a contact between the adjacent conductive connecting members 3 (defect caused by leakage).

Additionally, in the present image detecting device, the space keeping members 45 having electrical insulation are arranged in a lattice form so as to surround the conductive connecting members 3. With this arrangement, even when the conductive connecting members 3 and the space keeping members 45 are deformed due to poor forming accuracy, or even when the conductive connecting members 3 are pressed and deformed, the adjacent conductive connecting members 3 are separated from each other between the space keeping members 45 so as not to come into contact with each other. This arrangement of the present image detecting device can positively prevent a defect caused by leak.

[Embodiment 2]

The following explanation describes a second embodiment of the present invention. Here, in the present embodiment, those of the members described in the first embodiment are indicated by the same reference numerals and the description thereof is omitted.

The present embodiment describes a method(hereinafter, referred to as the present manufacturing method) for manufacturing a two-dimensional image detecting device (present image detecting device) of Embodiment 1.

Referring to FIGS. 1 and 2, the manufacture of an active-matrix substrate 1 is firstly discussed. The active-matrix substrate 1 is manufactured in the same process as an active-matrix substrate formed in a manufacturing process of a liquid crystal display device.

The active-matrix substrate 1 of the present manufacturing method is manufactured by forming the gate electrode 8, the Cs electrode 10, the insulating film 11, the a-Si film 12, the a-Si film 13, the source electrode 9, the pixel electrode 14, and the insulating protection film 15 (all are shown in FIG. 2) on the glass substrate 7 made of a non-alkali glass substrate, etc. (for example, #7059 and #1737 manufactured by Corning Industries, Inc.).

Namely, firstly, the gate electrode 8 and the Cs electrode 10 are formed on the glass substrate 7. The gate electrode 8 and the Cs electrode 10 are obtained as follows: a metal film made of a material such as Ta and Al is formed with a film thickness of approximately 3000 Å by using a spattering evaporation, and then, the metal film is patterned into a desired shape.

Secondly, the insulating film 11 is formed on the gate electrode 8 and the Cs electrode 10. The insulating film 11 is obtained by forming SiNx and/or SiOx into a film with a thickness of approximately 3500 Å by using a CVD method.

And then, the a-Si film 12 and the a-Si film 13 are formed on the insulating film 11. The a-Si film 12 and the a-Si film 13 are formed respectively with thicknesses of approximately 1000 Å and 400 Å by using the CVD method and are patterned into desired shapes.

Next, the source electrode 9 and the pixel electrode 14 are formed. The source electrode 9 and the pixel electrode 14 are obtained as follows: a metal film made of a material such as Ta and Al is formed with a film thickness of approximately 3000 Å, and the metal film is patterned into a desired shape.

Finally, the insulating protection film 15 is formed as follows: an insulating film made of SiNx and/or SiOx is formed with a thickness of approximately 6000 Å by using the CVD method, and the insulating film is patterned into a desired shape.

The above-mentioned process completes the active-matrix substrate 1.

Also, as the insulating film 11, it is possible to adopt (in combination with) an anodic oxidation film which is formed by anodizing the gate electrode 8 and the Cs electrode 10.

Moreover, as a material for the pixel electrode 14, it is possible to use a transparent electrode material such as ITO(indium tin oxide). Further, as a material for the insulating protection film 15, it is possible to adopt an organic film material such as acrylic and polyimide, in addition to an inorganic insulating film made of SiNx and /or SiOx.

Next, the manufacture of an opposing substrate 2 is discussed regarding the present manufacturing method.

The opposing substrate 2 is manufactured by stacking the upper electrode 17, the semiconductive layer 32, the carrier blocking layer 18, and the electrical charge collecting electrode 6(connecting electrode) on the glass substrate 31 in this order.

For the glass substrate 31, it is possible to adopt a glass substrate(for example, #7059 and #1737 manufactured by Corning Industries, Inc.) with a thickness of 0.7 mm–1.1 mm. And, upon manufacturing the opposing substrate 2, firstly, a material such as ITO and Au is used so as to form the upper electrode(electrode section)17 on virtually the entire surface of the glass substrate 31.

Secondly, the semiconductive layer 32, which has a polycrystal film made of CdTe or CdZnTe, is formed on the upper electrode 17. The semiconductive layer 32 is formed with a thickness of approximately 0.5 mm by using an MOCVD method.

Afterwards, the carrier blocking layer 18, which is a thin insulating layer made of AlOx, on virtually the entire surface of the semiconductive layer 32. As a construction of the carrier blocking layer 18, besides the aforementioned MIS junction structure, it is also possible to adopt a PIN(positive-intrinsic-negative diode) junction structure and a Shottky junction structure. Further, the carrier blocking layer 18 is preferably patterned for each pixel in response to the need.

Finally, the electrical charge collecting electrode 6, which has a conductive film made of a material such as Au and ITO, is formed on the carrier blocking layer 18. The electrical charge collecting electrode 6 is formed as follows: the conductive film is formed into a film with a thickness of approximately 2000 Å on the carrier blocking layer 18, and is patterned into a desired shape. Further, it is desirable to form the electrical charge collecting electrode 6 so as to oppose the pixel electrode 14 of the active-matrix substrate 1.

The above-mentioned process completes the opposing substrate 2.

Additionally, the MOCVD method, which forms a layer such as the semiconductive layer 32, is suited for forming a film on a large substrate. This method makes it possible to form a film at a temperature between 400 and 500° C.

As a material used for the MOCVD method forming the semiconductive layer 32, it is possible to adopt organic cadmium(dimethyl cadmium[DMCd]), organic tellurium (dietyl tellurium[DETe] and diisopropyl tellurium[DiPTe]), and organic zinc(diethyl zinc [DMZn], diisopropyl zinc [DiPZn], and dimethyl zinc[DMZn]), etc.

Furthermore, as a method for forming a film made of CdTe and/or CdZnTe, a screen printing and baking method, a spraying method, an electrodeposition method, and a proximity sublimation method, etc. are also available in addition to the MOCVD method.

Next, the following explanation describes bonding of the active-matrix substrate 1 and the opposing substrate 2.

As shown in FIG. 1, the present image detecting device has a construction in which the pixel electrodes 14 of the active-matrix substrate 1 are connected to the electrical charge collecting electrodes 6 of the opposing substrate 2 via the conductive connecting members 3 separately disposed for each pixel. Moreover, at places where no conductive connecting member 3 exists between the active-matrix substrate 1 and the opposing substrate 2, the space keeping members 45 are disposed.

The following explanation describes a bonding process of the substrates 1 and 2 as well as a specific forming method of the conductive connecting member 3 and the space keeping member 45. FIGS. 6(a) through 6(d) are explanatory drawings showing each step of the bonding process.

As shown in FIGS. 6(a) and 6(b), in this process, the conductive connecting members 3 are patterned and formed on a bonding surface of the active-matrix substrate 1, and the space keeping members 45 are patterned and formed on a bonding surface of the opposing substrate 2(pattern forming step). Here, the detail of the pattern formation is described later.

Next, as shown in FIG. 6(c), the active-matrix substrate 1, on which the conductive connecting members are patterned and formed, are aligned with the opposing substrate 2, on which the space keeping members 45 are patterned and formed(aligning step).

The alignment is performed such that the pixel electrodes 14 and the electrical charge collecting electrodes 6 of the substrates 1 and 2 oppose each other, such that the conductive connecting members 3 and the space keeping members 45 are not overlaid with each other, and such that the bonding surfaces of the substrates 1 and 2 oppose each other so as to correct displacement.

And then, as shown in FIG. 6(d), the aligned substrates 1 and 2 are subjected to a thermocompression bonding. This operation softens and bonds the conductive connecting members 3 to the pixel electrodes 14 and the electrical charge collecting electrodes 6; consequently, the substrates 1 and 2 are connected with each other(connecting step).

The above step completes the bonding process.

As described above, in the present manufacturing method, in the pattern forming process, the space keeping members 45, which maintain a gap between the substrates 1 and 2, are patterned and formed, in addition to the conductive connecting members 3. Hence, in the connecting step, even when the substrates 1 and 2 are strongly pressed, it is possible to prevent the gap between the substrates from being smaller than a predetermined value.

Therefore, the present manufacturing method makes it possible to maintain a gap between the substrates at a predetermined value, even when the substrates 1 and 2 are large(for example, substrate size of more than approximately 400 mm×500 mm). Consequently, it is possible to positively connect the pixel electrodes 14 and the electrical charge collecting electrodes 6 via the conductive connecting members 3.

Further, the space keeping members 45 can prevent the conductive connecting members 3 from being pressed and deformed too much. Hence, it is possible to eliminate a contact between the adjacent conductive connecting members 3(defect caused by leakage).

Moreover, in the present image detecting device, the conductive connecting members 3 and the space keeping members 45 are formed by patterning. This arrangement makes it possible to readily form the conductive connecting members 3 and the space keeping members 45 into desired shapes. Additionally, the conductive connecting members 3 are formed by patterning, so that it is possible to readily obtain electrical insulation between the storage capacitors 4(pixel electrodes 14) on the active-matrix substrate 1; thus, crosstalk can be suppressed.

Also, the space keeping members 45 are formed by patterning, so that it is possible to separately form the space keeping members 45 and the conductive connecting members 3 with ease. Thus, deformation and property degradation of the conductive connecting members 3 can be prevented upon bonding the substrates.

Figure 6:
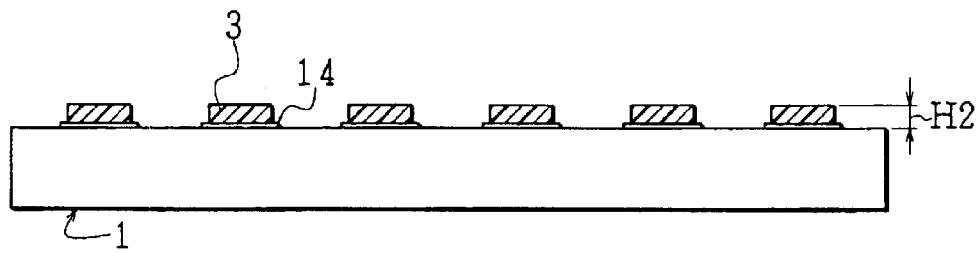
FIGS. 6(a) through 6(d) are explanatory drawings showing a bonding process regarding the two-dimensional image detecting device of FIG. 1.
Figure 6:
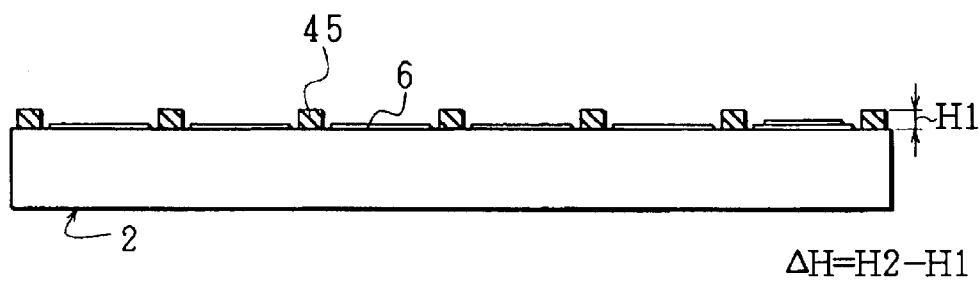
Figure 6:
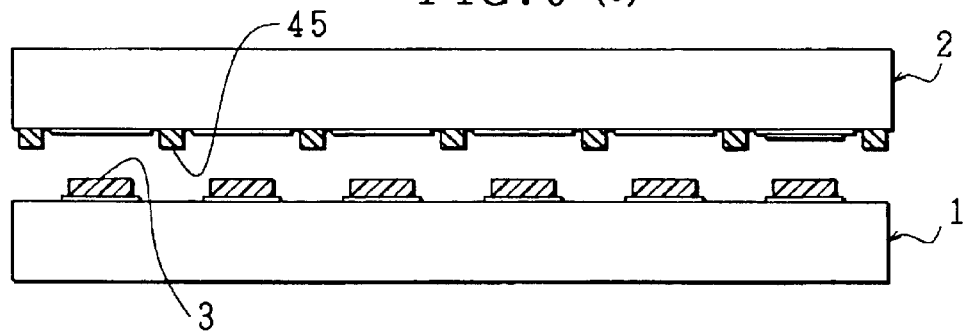
Figure 6:
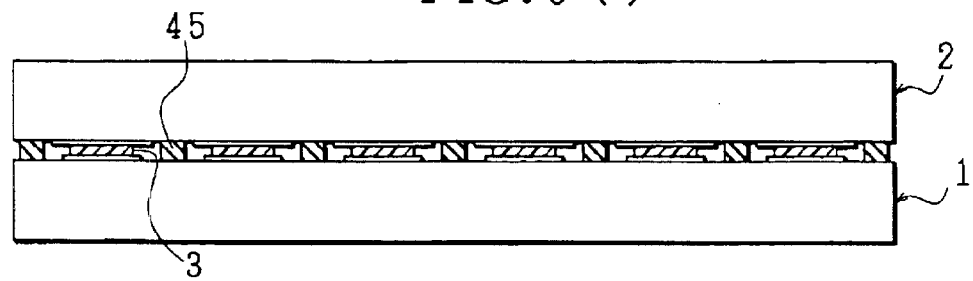

Furthermore, in the pattern forming steps of the present manufacturing method, the conductive connecting members 3 are formed by patterning on the active-matrix substrate 1(FIG. 6(*a*)), and the space keeping members 45 are formed by patterning on the opposing substrate 2(FIG. 6(*b*)). Namely, in the present manufacturing method, the conductive connecting members 3 and the space keeping members 45 are separately formed on the different substrates. Thus, the conductive connecting members 3 and the space keeping members 45 are separately subjected to a patterning operation.

Additionally, as shown in FIG. 4, when the space keeping members 45 are patterned so as to surround the pixel electrodes 14 (pixels) in a lattice form, a space surrounded by a lattice tends to trap air. For this reason, a pressing defect may appear. For example, air bubbles may be caught on the bonding surfaces of the conductive connecting members 3. Therefore, in this case, it is desirable to perform a press bonding (connecting step) under a reduced pressure.

Further, it is also possible to form both of the conductive connecting members 3 and the space keeping members 45 on either substrate 1 or 2. This arrangement is described later.

The following explanation describes the detail of the pattern forming step.

The pattern forming step includes a step for forming a pattern of the conductive connecting members 3 on the active-matrix substrate 1(connecting member forming step), and a step for forming a pattern of the space keeping members 45 on the opposing substrate 2 (keeping member forming step).

As a method for forming the pattern of the conductive connecting members 3 on the active-matrix substrate 1, the following methods (A1) through (A3) are adopted.

(A1) A photosensitive resin layer with conductivity is formed on virtually the entire bonding surface of the active-matrix substrate 1. And then, the pattern of the conductive connecting members 3 is formed by using a photolithography technology(including an exposure and developing operation).

(A2) A conductive adhesive is printed onto the bonding surface of the active-matrix substrate 1 by using a printing method such as a screen printing and an ink-jet printing, so as to form the pattern of the conductive connecting members 3.

(A3) A conductive resin is applied on the bonding surface of the active-matrix substrate 1 by electrodeposition so as to form the pattern of the conductive connecting members 3.

Particularly, method (A1) can precisely form the pattern of the conductive connecting members 3 and arrange the conductive connecting members 3 in desired shapes that correspond to the pixel electrodes 14. Therefore, the present manufacturing method adopts method (A1) for forming the pattern of the conductive connecting members 3.

Namely, in the pattern formation of the conductive connecting members 3 in accordance with the present manufacturing method, firstly, a dry film made of a photosensitive resin with conductivity is bonded(transferred) to virtually the entire surface of the active-matrix substrate 1. And then, the photosensitive resin is exposed and developed so as to form the pattern of the conductive connecting members 3 on the pixel electrodes 14.

Here, in this case, a height of the photosensitive resin, namely, a height H2(see FIG. 6(*a*)) of the conductive connecting member 3(height from the surface of the active-matrix substrate 1) is set at around 10 $\mu$m.

Meanwhile, as a method for forming a pattern of the space keeping members 45 on the opposing substrate 2, the following methods (B1) through (B3) are adopted.

(B1) An insulating photosensitive resin layer is formed on virtually the entire bonding surface of the opposing substrate 2. And then, the pattern of the space keeping members 45 are formed by using a photolithography technology.

(B2) A layer made of an organic or inorganic insulating material is formed on virtually the entire bonding surface of the opposing substrate 2. And then, a photosensitive photoresist layer is formed thereon, and the pattern of the space keeping members 45 is formed by using a photolithography technology and an etching technology.

(B3) Insulating paste is printed on the bonding surface of the opposing substrate 2 by using a printing method such as a screen printing and an ink-jet printing, so as to form the pattern of the space keeping members 45.

Particularly, method (B1) can precisely form the pattern of the space keeping members 45 and arrange the space keeping members 45 in desired shapes that correspond to the pixel electrodes 14. Therefore, the present manufacturing method forms the pattern of the space keeping members 45 in accordance with method (B1).

Namely, upon forming the pattern of the space keeping members 45 in accordance with the present manufacturing method, an insulating photosensitive resin is applied on virtually the entire bonding surface of the opposing substrate 2 and is subjected to a pre-baking operation. And then, the photosensitive resin is subjected to an exposing and developing operation, and a post-baking operation. This method forms the pattern of the space keeping members 45 so as to surround the electrical charge collecting electrodes 6. Here, a height of the photosensitive resin, namely, a height H1 of the space keeping member 45 is set at around 8 μm.

Here, the following explanation discusses the sizes of the conductive connecting member 3 and the space keeping member 45.

As described above, in the present manufacturing method, the height H1 of the space keeping member 45 is set at 8 μm, and the height H2 of the conductive connecting member 3 is set at 10 μm. As described above, in the present manufacturing method, it is desirable to set the heights H1 and H2 between 5 μm and 30 μm.

This is because when the heights H1 and H2 are smaller than 5 μm, a space between the substrates 1 and 2 (substrate gap) becomes too small in the connecting step(FIG. 6(d)), thereby increasing the occurrence of a connecting defect, which is caused by dust and dirt on the surfaces of the substrates 1 and 2. Meanwhile, when the heights H1 and H2 are higher than 30 μm, it becomes difficult to pattern the conductive connecting members 3 and the space keeping members 45.

Figure 7:
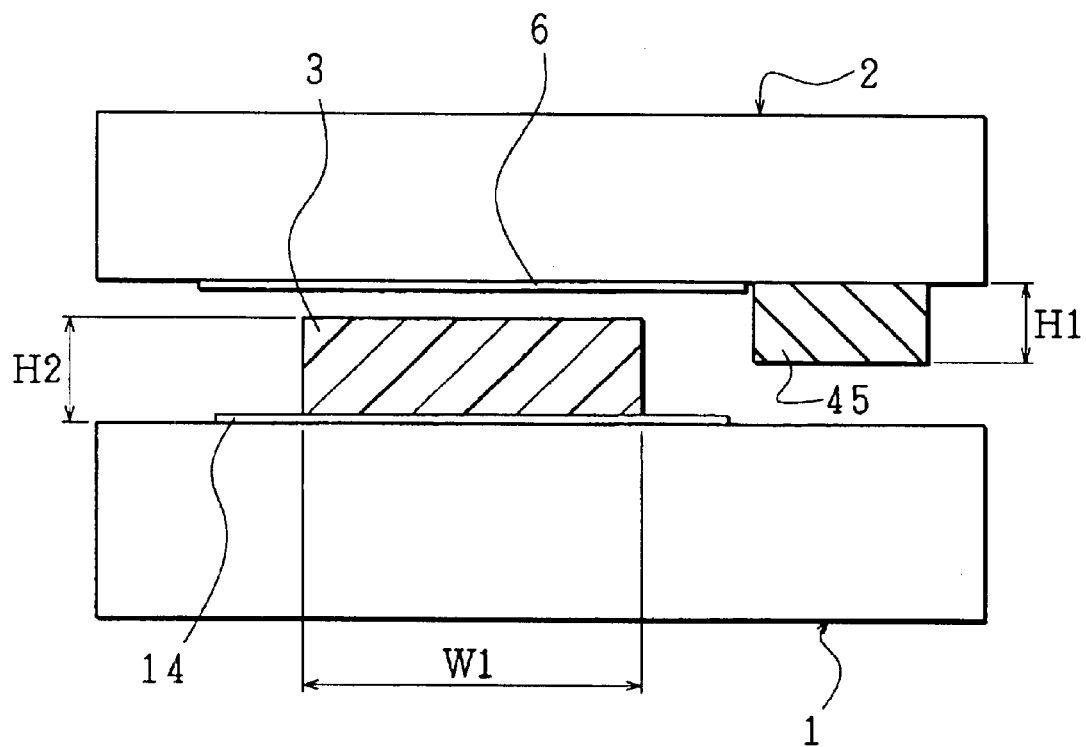
FIGS. 7(a) and 7(b) are explanatory drawings showing a bonding process of the two-dimensional image detecting device shown in FIG. 1.
Figure 7:
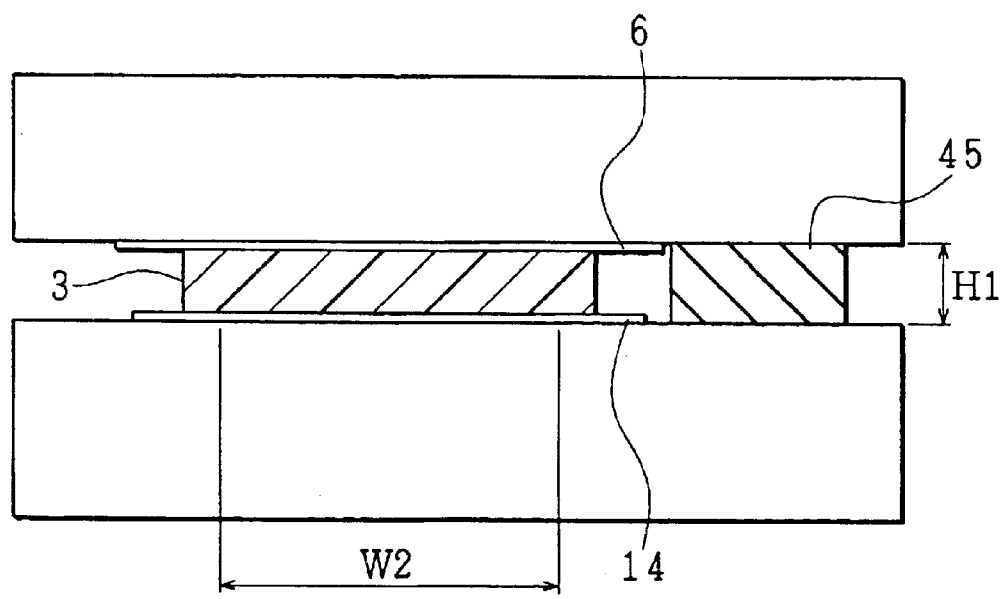

Next, the following explanation describes a desirable relationship between the height H1 and H2. FIGS. 7(a) and 7(b) are sectional drawings showing the conductive connecting member 3 and the space keeping member 45 before and after the active-matrix substrate 1 and the opposing substrate 2 are bonded to each other (before and after the connecting step).

As described above, the height H1 of the space keeping member 45 is set at 8 μm before bonding, and the height H2 of the conductive connecting member 3 is set at 10 μm. In the present manufacturing method, it is desirable to set the heights H1 and H2 so as to satisfy H2≧H1. Hereinafter, the reason is described.

Namely, in the present manufacturing method, the conductive connecting members 3 are softened in the thermocompression bonding of the connecting step, so that a gap between the substrates 1 and 2 is determined in accordance with the height H1 of the space keeping member 45.

For this reason, when the conductive connecting members 3 is set higher than the space keeping members 45 (H2≧H1, FIG. 7(a)), the conductive connecting members 3, which are softened by heating, are pressed and deformed (FIG. 7(b)). Therefore, the conductive connecting members 3 can be positively brought into contact with the substrates 1 and 2. Thus, in the present manufacturing method, it is desirable to set the height H1 of the space keeping member 45 and the height H2 of the conductive connecting member 3 so as to satisfy H2≧H1.

Further, in the case of H2≧H1, as described above, the conductive connecting members 3 are pressed and expanded upon bonding the substrates. Hence, as shown in FIG. 7(b), a patterned area of the conductive connecting member 3 increases from W1 to W2, by W2−W1, during the bonding operation.

Thus, in the present manufacturing method, it is desirable to set the pattern area W1 of the conductive connecting member 3 before bonding, such that the pattern area W2 is within the pixel electrode 14 after bonding.

Furthermore, in an actual operation, the patten area of the conductive connecting member 3 is controlled so as to increase by two times or less during the bonding operation, so that a defect caused by leak can be effectively prevented. For this reason, the height H1 of the space keeping member 45 and the height H2 of the conductive connecting member 3 are preferably set so as to satisfy 2×H1≧H2≧H1.

As mentioned above, the optimum setting condition of the height H2 of the conductive connecting member 3 is 2×H1≧H2 relative to the height H1 of the space keeping member 45.

When the setting satisfies the above condition, even when the substrates 1 and 2 are large, it is possible to tolerate uneven thicknesses of the conductive connecting members 3 and the space keeping members 45 to a degree. Thus, connections can be positively obtained between the electrical charge collecting electrodes 6 and the pixel electrodes 14.

The following explanation describes materials of the conductive connecting member 3 and the space keeping member 45.

Regarding the space keeping member 45, it is desirable to adopt a material which allows the space keeping member 45 to be less prone to deformation than the conductive connecting member 3, upon performing the thermocompression bonding in the connecting step (FIG. 6(d)). This is because when the shape of the space keeping member 45 is less prone to deformation, it is possible to improve the space keeping ability of the substrates 1 and 2.

Meanwhile, regarding the conductive connecting member 3, it is desirable to adopt a material which is softened to a degree in the thermocompression bonding. This is because such a material can improve adhesion between the conductive connecting members 3 and the substrates 1 and 2.

For instance, as the conductive connecting member 3, it is possible to adopt a material which is softened at around 130° C. with bonding property(adhesion), and as the space keeping member 45, it is possible to adopt a material which is softened at 150° C. or more. In this case, when the thermocompression bonding is performed between 130° C. and 150° C., the conductive connecting members 3 are softened and bonded to the substrates 1 and 2 with ease; meanwhile, the space keeping members 45 are not softened. Thus, it is possible to bond the substrates 1 and 2 to each other while maintaining the space keeping ability of the space keeping members 45.

Therefore, when a material which is softened so as to be adhesive is adopted as the conductive connecting member 3, it is desirable to set the softening temperature lower than that of the space keeping member 45. Here, as such a material (conductive photosensitive resin which is softened so as to be adhesive), it is possible to adopt a material which is obtained by adding a conductive pigment such as carbon into photopolymerizing resin such as acrylic.

Moreover, for the conductive connecting member 3, it is possible to adopt a thermosetting or a photo-curing adhesive. Since most adhesives originally have adhesion and are sufficiently prone to deformation, it is desirable to adopt a material which is less prone to deformation(hard), as the space keeping member 45. Here, as such a conductive adhesive, it is possible to adopt a material which is obtained by adding a conductive pigment into a thermosetting or photocuring adhesive such as acrylic and epoxy.

Specifically, as a material for the space keeping member 45, it is desirable to adopt a photosensitive polyimide polymeric material, which has a relatively high softening temperature. The polyimide polymeric material is superior in electrical insulation, has a softening point at 300° C. or more, and is stable to radiation. For this reason, the polyimide polymeric material is best suited for the space keeping member 45 of the present manufacturing method.

Additionally, as a material for the space keeping member 45, epoxy, acrylic, urethane, and other polymeric materials can be adopted. Further, it is possible to form the space keeping member 45 having an inorganic insulating film by using any one of the aforementioned methods (B1) through (B3). The inorganic insulating film is made of a material such as $SiO_2$ and is obtained by a sol-gel film forming method, a coating method, and a paste printing method.

Figure 8:
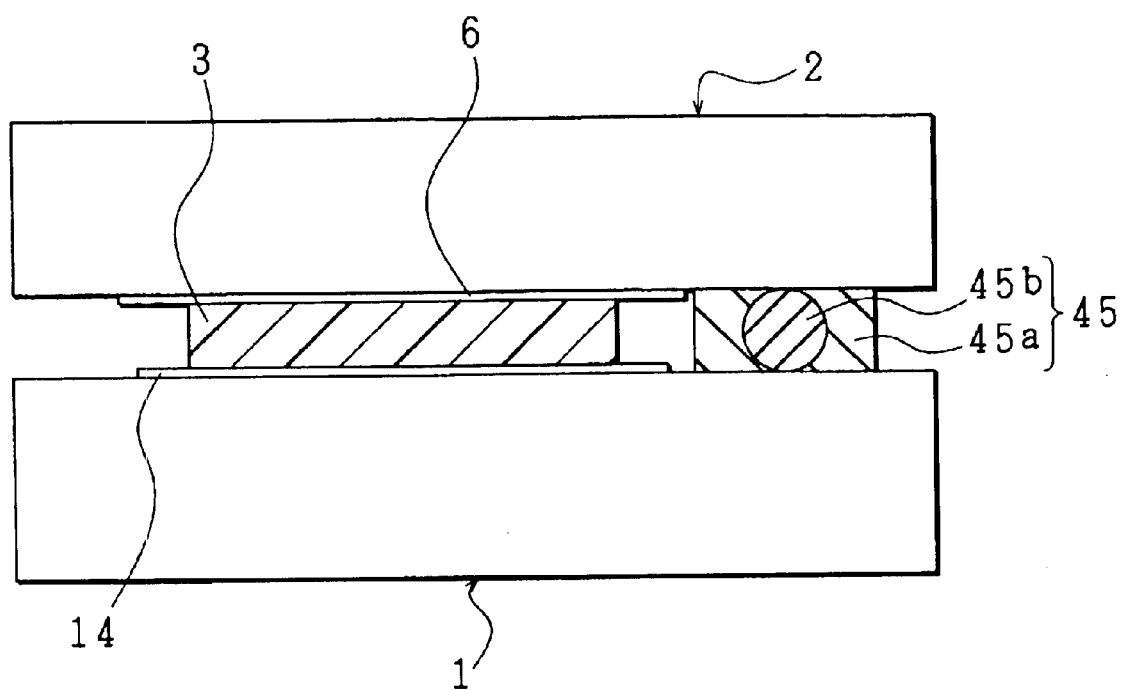
FIG. 8 is a sectional drawing showing an example of the space keeping members regarding the two-dimensional image detecting device of FIG. 1.

Also, as shown in FIG. 8, as the space keeping member 45, a reinforcing material (strength reinforcing material) 45b are placed into a resin material 45a having electrical insulation. The reinforcing material 45b is a ball having electrical insulation and reinforces the strength of the resin material 45a.

The above-mentioned reinforcing member 45b makes it possible to obtain hardness of the space keeping member 45, even when the hardness of the resin material 45a is lower than that of the conductive connecting member 3. Therefore, it is possible to positively maintain the gap between the substrates 1 and 2.

For the reinforcing member 45b, glass, ceramic, and plastic materials can be adopted. Particularly, glass or ceramic reinforcing member 45b has electrical insulation and causes merely small deformation while being heated and pressurized. For this reason, glass and ceramic are best suited for a material (strength reinforcing material) of the reinforcing member 45b, which is placed into the resin material 45a.

Moreover, when the reinforcing material 45b is used, it is desirable to pattern the resin material 45a after the reinforcing member 45b is placed into the resin material 45a. This arrangement allows the reinforcing member 45b to exist merely in the patterned resin material 45a. Therefore, it is possible to prevent the reinforcing member 45b from entering the bonding surface of the conductive connecting member 3 and interfering with the bonding of the conductive connecting member 3.

Here, the reinforcing member 45b merely needs to be placed in the resin material 45a in order to maintain the gap between the substrates 1 and 2; thus, the shape of the reinforcing member 45b is not limited to a ball. For example, a grain shape and a textile (fiber) shape, etc. are also acceptable. However, when the reinforcing member 45b is a ball, the resin material 45a can be evenly applied, so that the pattern can be readily formed. Additionally, it is desirable to set the height of the reinforcing member 45b from the surface of the opposing substrate 2 at virtually the same as the height H1 of the space keeping member 45.

Figure 9:
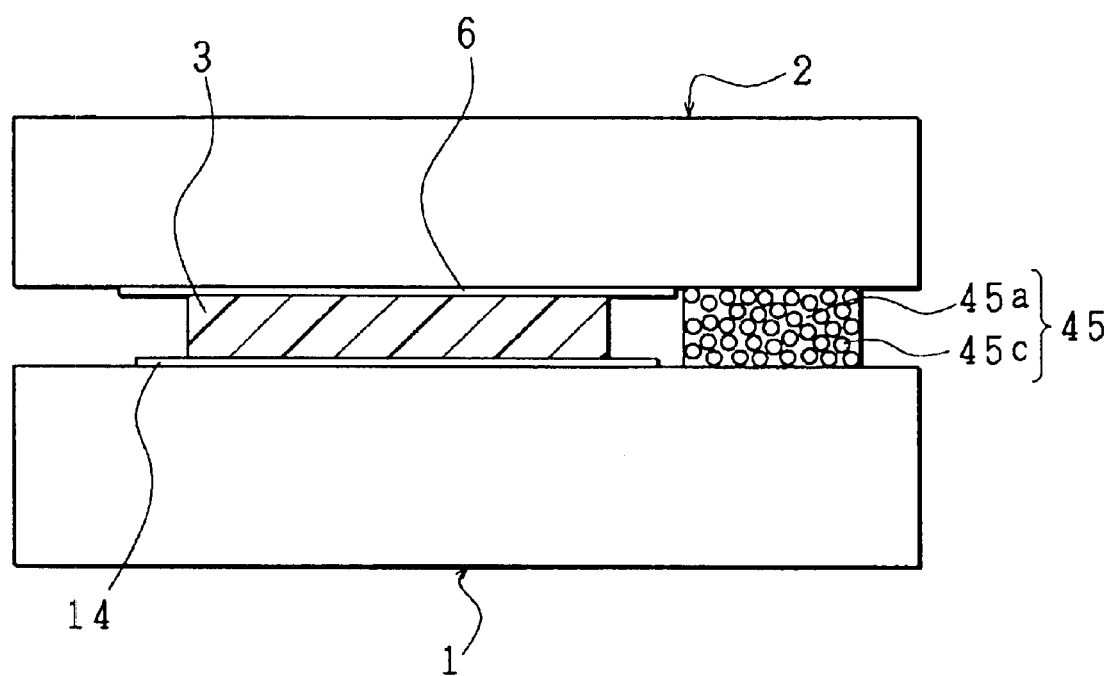
FIG. 9 is a sectional drawing showing a state in which fine particles are mixed into the space keeping member of the two-dimensional image detecting device shown in FIG. 1.

Further, as shown in FIG. 9, in order to increase the hardness of the space keeping member 45, it is also effective to place particles 45c having electrical insulation into the resin material 45a, instead of the reinforcing member 45b. The particles 45c are generally called a filler and are mixed into an adhesive resin to adjust the viscosity and the hardness of the adhesive resin. Therefore, the particles 45c are mixed into the resin material 45a so as to positively improve the hardness of the space keeping member 45.

Here, as a material of the particles 45c, it is possible to adopt glass, ceramic, and plastic and other particles. If the reinforcing member 45b and the particles 45c are placed into the resin material 45a, it is possible to improve the hardness of the resin material 45a.

Next, the following explanation describes a case in which the patterns of the conductive connecting members 3 and the space keeping members 45 are formed by using a screen printing.

In this case, a screen printing of the conductive connecting members 3 preferably adopts an Ni metal mask, and a screen printing of the space keeping members 45 preferably adopts a normal mesh screen. When the screen printing is adopted for forming a pattern of the conductive connecting members 3 and the space keeping members 45, the patterning accuracy is inferior to the photolithography; however, the manufacturing device can be obtained at lower cost. Therefore, the screen printing is quite effective for the two-dimensional image detecting device having a large pitch between the pixels.

Additionally, the conductive connecting member 3 has a small diameter of around $\Phi 50$ $\mu$m, so that a normal mesh screen cannot form clear printing holes. Hence, an Ni metal mask is suitable for the screen printing of the conductive connecting members 3. Further, in this case, it is possible to adopt epoxy adhesive paste, which contains Ag conductive particles, as a material of the conductive connecting members 3.

Meanwhile, for the screen printing of the space keeping members 45, a normal mesh screen can be used. Further, as a material of the space keeping members 45, it is possible to adopt a variety of insulating printing materials including a polyimide polymeric material.

Next, the following explanation describes the bonding process of the active-matrix substrate 1 and the opposing substrate 2 upon forming the conductive connecting members 3 and the space keeping members 45 on the same substrate. In the following explanation, the patterns of the conductive connecting members 3 and the space keeping members 45 are formed on the active-matrix substrate 1.

Figure 10:
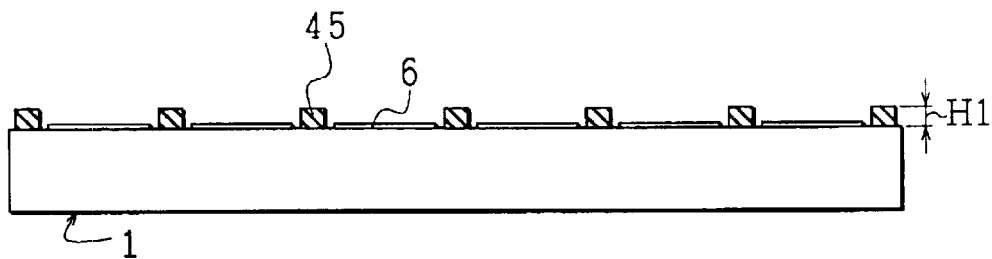
FIGS. 10(a) through 10(d) are explanatory drawings showing another bonding process regarding the two-dimensional image detecting device of FIG. 1.
Figure 10:
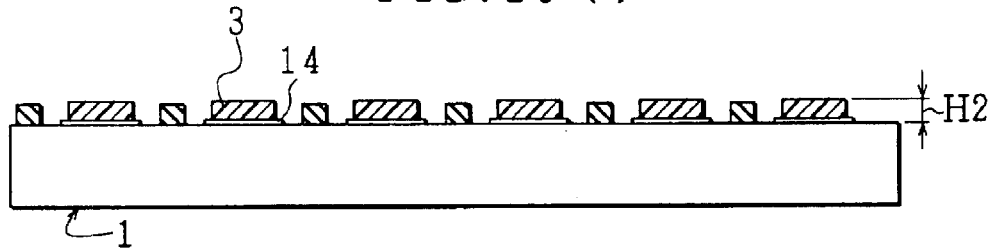
Figure 10:
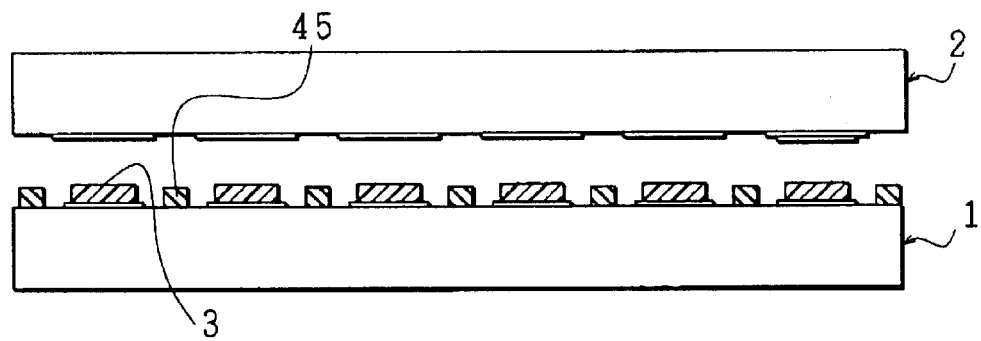
Figure 10:
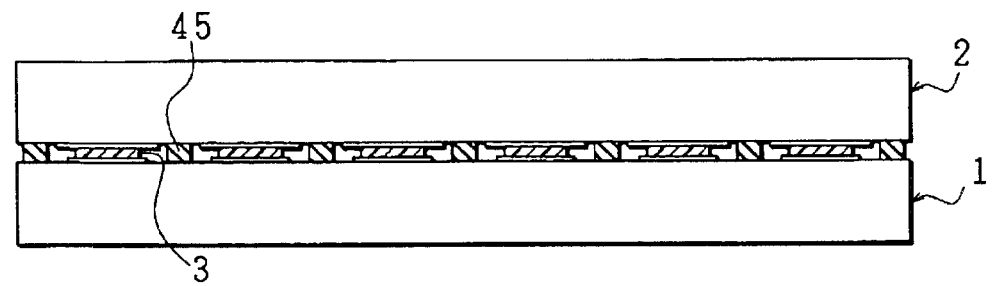

Firstly, as shown in FIG. 10(a), on the bonding surface of the active-matrix substrate 1, the pattern of the space keeping members 45 are formed(keeping member forming step). Here, as a method for forming the pattern of the space keeping members 45, the aforementioned methods (B1) through (B3) can be adopted. Among them, method (B1) is superior in precisely forming the pattern of the space keeping members 45 and in forming the space keeping members 45 into desired shapes in accordance with the pixel electrodes 14.

Therefore, the following explanation discusses method (B1) for forming the pattern of the space keeping members 45. In this method, firstly, a filler is contained, and an insulating photosensitive resin sheet having sufficient hardness is bonded to virtually the entire bonding surface of the active-matrix substrate 1.

And then, the photosensitive resin sheet is subjected to an exposing, developing, and post-baking operation. Hence, on the active-matrix substrate 1, the photosensitive resin is patterned into island shapes so as to serve as the space keeping members 45. Here, after the pattern is formed, the height H1 of the photosensitive resin, namely, the space keeping members 45 is set at around 8 $\mu$m.

Next, as shown in FIG. 10(b), the pattern of the conductive connecting members 3 is formed(connecting member forming step) on the pixel electrodes 14 of the active-matrix substrate 1, on which the patten of the space keeping members 45 has been formed.

In this case, because of projections and depressions in the pattern of the space keeping members 45, it is difficult to evenly apply a conductive connecting resin onto the active-matrix substrate 1.

Therefore, in order to eliminate influence of the projections and depressions, the pattern formation of the conductive connecting members 3 adopts a special photosensitive resin sheet, which is provided with a thermoplastic resin layer (cushion layer). And then, the sheet is subjected to a bonding step and a photolithography step so as to form the pattern of the conductive connecting members 3.

The pattern formation of the conductive connecting members 3 is described later. Further, after the pattern is formed, the height H2 of the photosensitive resin, namely, the conductive connecting members 3 is set at around 10 μm.

And then, as shown in FIG. 10(c), the opposing substrate 2 is aligned with the active-matrix substrate 1(aligning step), on which the patterns of the space keeping members 45 and the conductive connecting members 3 have been formed. In this alignment, the bonding surfaces of the substrates 1 and 2 are opposed to each other such that the pixel electrodes 14 and the electrical charge collecting electrodes 6 of the substrates 1 and 2 oppose each other.

Subsequently, as shown in FIG. 10(d), the aligned substrates 1 and 2 are subjected to a thermocompression bonding so as to be connected with each other (connecting step). This step completes the bonding process.

Referring to FIGS. 11(a) through 11(c), the following explanation describes the process for forming the pattern of the conductive connecting members 3, which use a photosensitive resin sheet having a thermoplastic resin layer (connecting member forming step). As shown in FIG. 11(a), a photosensitive resin sheet (bonding sheet) 101 has a construction in which a photosensitive resin layer (conductive connecting layer) 102, a thermoplastic resin layer (cushion layer) 103 and a supporting film 104 are stacked.

The thermoplastic resin layer 103 is softened by heating with a light-transmitting property, and is melted in a developing solution used for a developing operation.

As shown in FIG. 11(a), in the connecting member forming step, the pressure of a heat roller 111 bonds the photosensitive resin sheet 101 onto the active-matrix substrate 1 such that the photosensitive resin layer is disposed lower (bonding step), on which the pattern of the space keeping members 45 has been formed.

And then, as shown in FIG. 11(a), in the bonding step, the deformation of the photosensitive resin layer 102 is tolerated by the thermoplastic resin layer 103. This arrangement achieves virtually the even surface of the supporting film 104, so that the pressure of the heat roller 111 can be evenly transmitted onto the photosensitive resin layer 102.

After the bonding step, as shown in FIGS. 11(b) and 11(c), the supporting film 104 is removed, and an exposing and developing operation (photolithography step) is performed, so that the pattern of the conductive connecting members 3 is formed.

As described above, the photosensitive resin sheet 101 having the thermoplastic resin layer 103 is used so as to bond the photosensitive resin layer 102 onto the active-matrix substrate 1 without catching air bubbles, even around the projections and depressions on the pattern of the space keeping members 45. Thus, it is possible to readily form the pattern of the conductive connecting members 3.

As mentioned above, in the bonding process shown in FIGS. 11(a) through 11(c), the conductive connecting members 3 and the space keeping members 45 are formed on the same substrate. This arrangement can prevent the pattern from being formed on one of the active-matrix substrate 1 and the opposing substrate 2, that is more prone to adverse effect of the pattern forming process of the conductive connecting members 3 and the space keeping members 45.

For instance, upon exposure to a solution (developing solution, etc.) required for the pattern forming process of the conductive connecting members 3 and the space keeping members 45, the property may change as for the semiconductive layer 32 on the opposing substrate 2. In this case, the patterns of the conductive connecting members 3 and the space keeping members 45 are formed on the active-matrix substrate 1 so as to prevent degradation of the semiconductive layer 32.

Additionally, when the patterns of the conductive connecting members 3 and the space keeping members 45 are formed on one of the substrates, it is desirable to reduce a possibility that the projections and depressions of the formed pattern interfere with the following pattern formation. Therefore, it is desirable to firstly form the pattern of one of the conductive connecting members 3 and the space keeping members 45, that have a lower height when the pattern is completed, and then, to form the pattern of the other.

For instance, as described above, when the heights H1 and H2 (see FIGS. 10(a) and 10(b)) of the space keeping members 45 and the conductive connecting members 3 are respectively set at about 8 μm and about 10 μm, it is desirable to form the pattern of the space keeping members 45, and then to form the pattern of the conductive connecting members 3.

Further, a manufacturing technology of a bonding sheet having a thermoplastic resin layer is fully described in Japanese Laid-Open Patent Publication No.173320/1993 (Tokukaihei 5-173320, published on Jul. 13, 1993). Moreover, in the pattern formation of the space keeping members 45, that is shown in FIG. 10(a), the pattern of the photosensitive resin serves as the space keeping members 45.

Moreover, in the manufacturing method shown in FIGS. 10(a) through (d), the photosensitive resin sheet 101 is used merely for the pattern formation of the conductive connecting members 3 which are formed after the space keeping members 45. However, the use of the photosensitive resin sheet 101 is not limited to this case. When the conductive connecting members 3 are previously formed by patterning, the photosensitive resin sheet 101 is preferably used for the pattern formation of the space keeping members 45. Further, it is also possible to form the patterns of the conductive connecting members 3 and the space keeping members 45 by using the photosensitive resin sheet 101. Additionally, it is also possible to form the pattern of either the conductive connecting members 3 or the space keeping members 45 by using the photosensitive resin sheet 101.

Here, the present image detecting device and the present manufacturing method of Embodiments 1 and 2 do not limit the scope of the present invention. These embodiments are allowed to vary in many ways within the scope of the present invention. For example, the following constructions are also acceptable.

The present image detecting device can also serve as a two-dimensional image detecting device which responds to a visible light and an infrared light as well as a radiation (X-ray, etc.). This is achieved by using the semiconductive layer 32 (photoconductor) which exhibits photoconductivity to a visible light and an infrared light as well as a radiation.

In this case, a transparent electrode, which is made of a material such as ITO and $SnO_2$ and transmits a visible light and an infrared light, is preferable adopted for the upper electrode 17(see FIG. 2) disposed on the light-receiving side of the semiconductive layer 32. Further, it is preferable to optimize a thickness of the semiconductive layer 32 in accordance with the absorbing efficiency of a visible light and an infrared light.

Moreover, in order to reduce dark current, the present image detecting device is provided with the carrier blocking layer 18 between the electrical charge collecting electrode 6 and the semiconductive layer 32. It is also preferable to provide an insulating layer between the semiconductive layer 32 and the upper electrode 17. This arrangement can prevent electrical charge from being injected from the upper electrode 17 to the semiconductive layer 32, thereby reducing dark current more effectively.

Further, in the present image detecting device, the TFT 5, which uses a-Si in an inverse stagger structure, is adopted as a TFT element. However, the TFT 5 of the present image detecting device is not limited to this structure. A structure using p-Si and a stagger structure are also acceptable. Furthermore, in the present image detecting device, the pixel electrode 14 is used in combination with the drain electrode; however, these can be separately formed.

Additionally, Embodiments 1 and 2 show CdTe and CdZnTe as a material of the semiconductive layer 32; however, the material is not limited to these. For example, the semiconductive layer 32 can be formed by a semiconductive material such as a-Se and a-Si.

Further, the opposing substrate 2 (sensor substrate) can have a construction in which a semiconductive substrate serves as a supporting substrate, without using a supporting substrate such as a glass substrate. Also, a visible light sensor can be combined with a converting layer(for example, CsI) for converting a radiation(X-ray) into a visible light.

Figure 12:
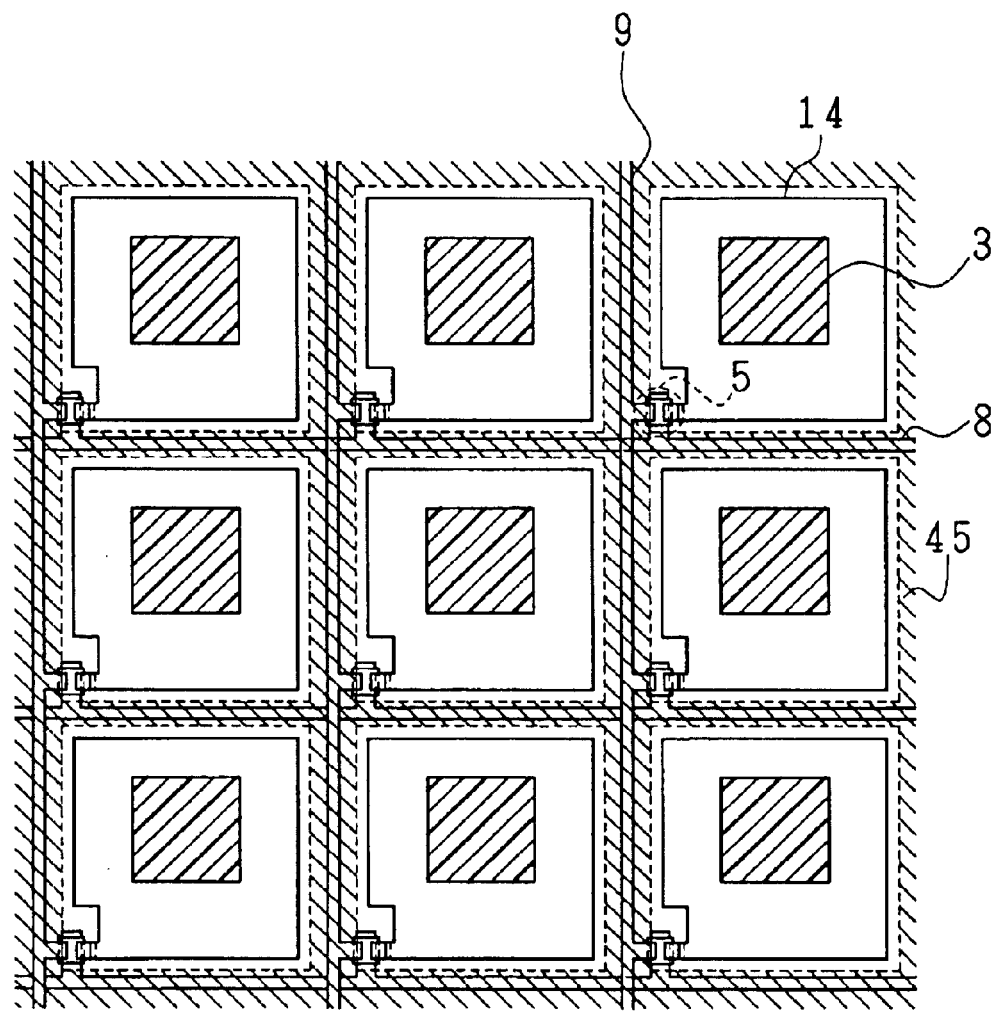
FIG. 12 is a plan view showing another formation of the conductive connecting members in the two-dimensional image detecting device of FIG. 1.

Moreover, in FIGS. 4 and 8 of Embodiment 1, the shape of the conductive connecting member 3 has a cylinder shape; however, the shape is not limited to a cylinder. As shown in FIG. 12, a prism shape is allowed for the conductive connecting member. Further, the electrode 17 (see FIG. 2) can have a conductive film made of Ta.

Additionally, as a material of the space keeping member 45, it is also possible to adopt a material having bonding property or adhesion to the active-matrix substrate 1 and the opposing substrate 2. In this case, the connecting strength can be improved between the substrates 1 and 2. Further, it is possible to mix the reinforcing member 45b (see FIG. 8) and a particle 45c (see FIG. 9) with the resin material 45a constituting the space keeping member 45.

Moreover, the Dattern of the space keeping members 45 is not limited to the pattern (matrix form) shown in FIG. 4, so that the pattern can be formed into a desired one including stripes and dots.

Additionally, it is desirable to provide the pattern of the space keeping members 45 as a dummy pattern around a photographing effective area, in addition to in an area (a photographing effective area), in which pixels exist in a matrix form. Therefore, upon bonding the substrates, it is possible to maintain an even space (gap) of the substrates in an edge of the substrates as well.

Further, according to the present method, a thermocompression bonding operation is performed on the substrates 1 and 2 in the connecting step (FIGS. 6(b) and 10(d)); however, the substrates can be pressed and bonded to each other, without heating.

Furthermore, in the bonding process shown in FIGS. 6(a) through 6(d), the connecting member forming step (FIG. 6(a)), the keeping member forming step (FIG. 6(b)), the aligning step (FIG. 6(c)), and the connecting step (FIG. 6(d)) respectively correspond to first through fourth steps of claim 59.

Moreover, in the bonding process shown in FIGS. 10(a) through 10(d), the keeping member forming step (FIG. 10(a)), the connecting member forming step (FIG. 10(b)), the aligning step (FIG. 10(c)), and the connecting step (FIG. 10(d)) respectively correspond to first through fourth steps of claim 62.

Additionally, the present image detecting device can also have the following construction in which the active-matrix substrate 1 having the pixel electrodes 14 formed and the opposing substrate 2 having the electrical charge collecting electrodes 6 formed are bonded to each other such that the pixel electrodes 14 and the electrical charge collecting electrodes 6 oppose each other, via the conductive connecting members 3 and the space keeping members 45, that are independently disposed for each pixel.

Further, the conductive connecting members 3 and the space keeping members 45 can be made of materials having photosensitivity. Thus, photolithography technology achieves the pattern formation of the conductive connecting members 3 and the space keeping members 45.

Figure 15:
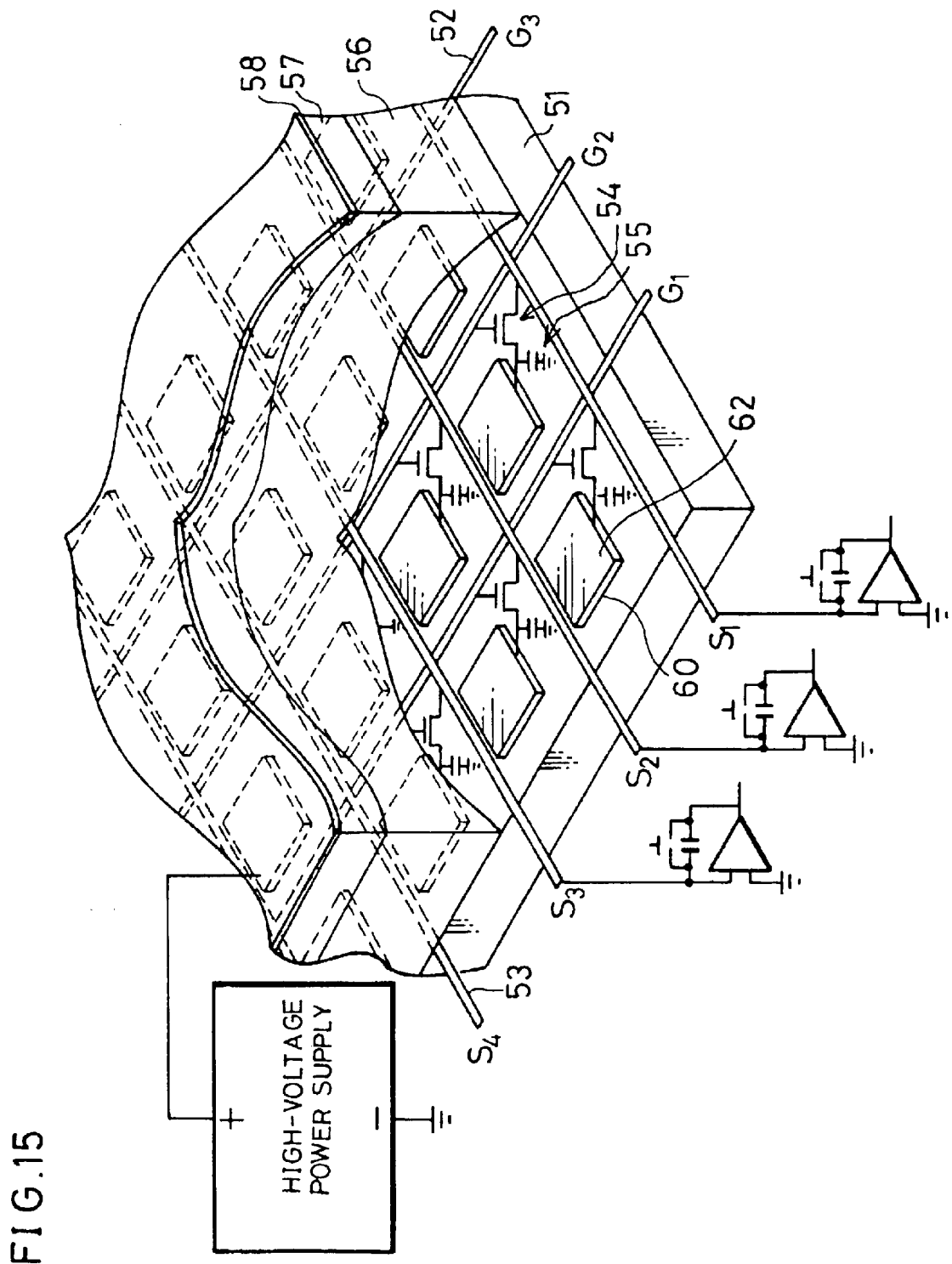
FIG. 15 is a perspective view showing a construction of a two-dimensional image detecting device for radiation.
Figure 16:
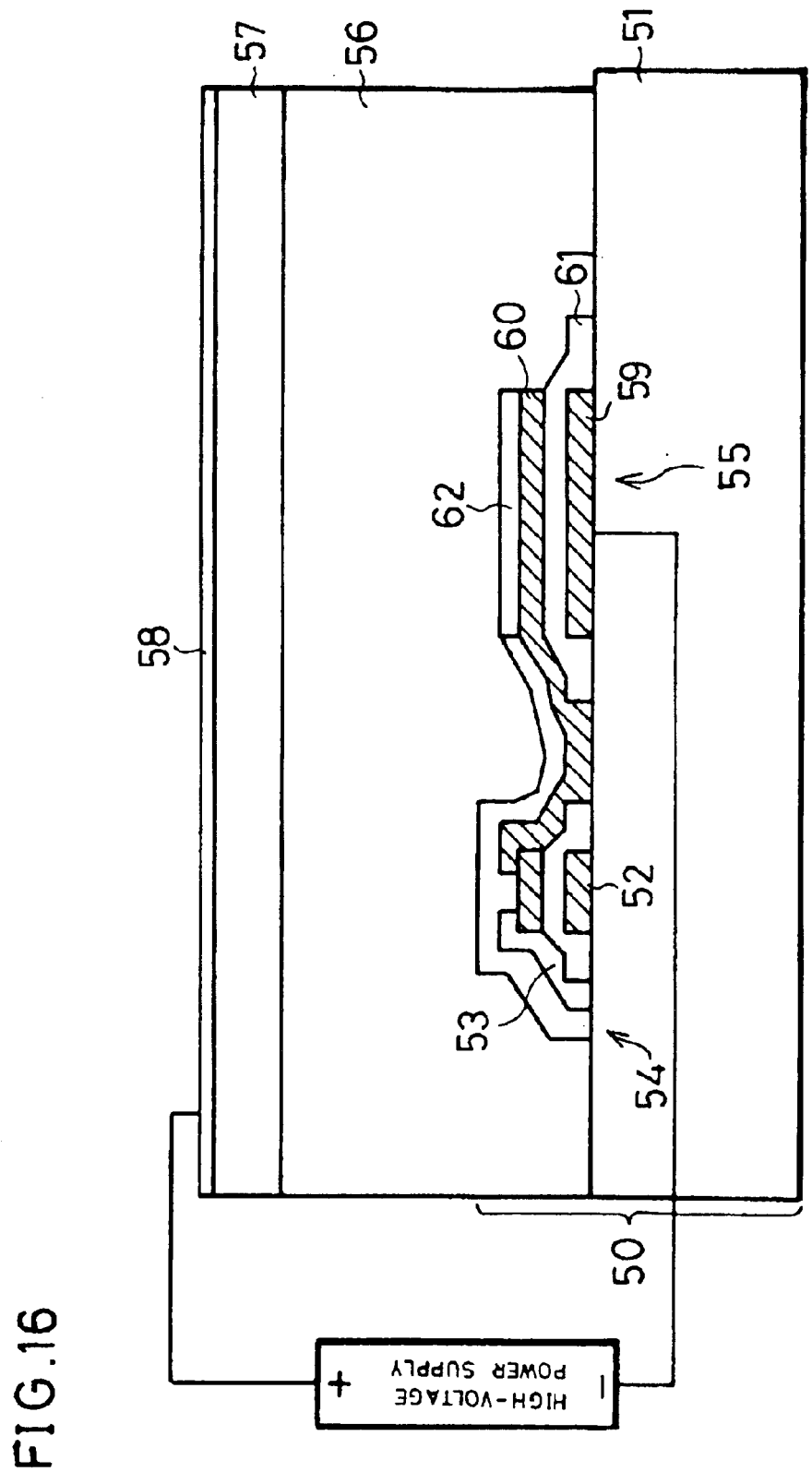
FIG. 16 is a sectional view showing a construction of one pixel of the conventional two-dimensional image detecting device for radiation.

Moreover, as for the present image detecting device, it is preferable to arrange the electrode wires (gate electrodes 8 and source electrodes 9), the TFTs 5, the storage capacitors 4, and others in an XY matrix form, as shown in FIG. 15 of the conventional art. With this arrangement, signals inputted to the gate electrodes G1, G2, G3, . . . , and Gn are scanned successively for every line so as to two-dimensionally obtain image information of a radiation(X-ray). Furthermore, the present image detecting device can have the basic principle of the operation that is similar to that of the conventional image detecting device.

Additionally, in the present image detecting device, the storage capacitors 4 and the semiconductive layer 32 can be connected in series via the pixel electrodes 14, the conductive connecting members 3, and the electrical charge collecting electrodes 6.

Moreover, the arrangement of the conductive connecting members 3 and the space keeping members 45 of FIG. 4 is a typical pattern of the above-mentioned arrangements. Further, in the present image detecting device, the space keeping members 45 can be disposed among a plurality of the conductive connecting members 3 connecting the pixel electrodes 14 and the electrical charge collecting electrodes 6. With this arrangement, in the case of poor patterning accuracy of the conductive connecting members 3 and the space keeping members 45, or when the conductive connecting members 3 are pressed and deformed, it is possible to prevent the adjacent conductive connecting members 3 from being contact with each other, although the conductive connecting members 3 and the space keeping members 45 may come into contact with each other. Hence, the occurrence of electrical leak can be positively prevented between the adjacent conductive connecting members Furthermore, the reinforcing member 45b of FIG. 8 may be effective when the space keeping ability cannot be fully offered due to insufficient hardness of the space keeping member 45.

Moreover, in the present manufacturing method, (a) the i-type a-Si film 12 serving as a channel portion of the TFT 5 and (b) the $n^+$-type a-Si film 13 for making a contact between the source electrode 9 and the drain electrode can be formed into films respectively having thicknesses of about 1000 Å and 400 Å, and then, the films can be patterned and formed into desired shapes.

Here, the pattern formation of the conductive connecting members 3 and the space keeping members 45 of the present manufacturing method is not limited to the aforementioned semiconductive layer 32(photoconductive layer) and sensor structure. The pattern formation is also applicable to a two-dimensional image detecting device using other photoconductive materials and sensor structures.

Further, in the present manufacturing method, the pattern formation of the space keeping members 45 can be performed as follows: a layer made of an organic or inorganic insulating material is formed on virtually the entire bonding surface of the opposing substrate 2, a photosensitive photoresist layer is formed thereon, and then, the insulating materials are formed into the pattern of the space keeping members 45 by using photolithography and etching technology.

Furthermore, in the pattern formation of the present manufacturing method, prior to bonding, the height H1 of the space keeping member 45 is set at 8 μm, and the height H2 of the conductive connecting member 3 is set at 10 μm (FIG. 7(a)). Thus, upon bonding the active-matrix substrate 1 and the opposing substrate 2, the gap between the substrates is determined in accordance with the height H1 of the space keeping members 45, so that the conductive connecting members 3, which are softened by heating, are pressed and deformed (FIG. 7(b)). Hence, the conductive connecting members 3 can be positively brought into contact with the substrates. Consequently, it is desirable to set the height H1 of the space keeping members 45 and the height H2 of the conductive connecting members 3 so as to satisfy H2≧H1.

As shown in FIG. 7(b), the bonding of the active-matrix substrate 1 and the opposing substrate 2 allows the gap between the substrates to be smaller than the height H2 of the conductive connecting members 3, so that the pattern area of the conductive connecting member 3 is increased from W1 to W1, by W2−W1, during the bonding operation. Thus, it is desirable to set the pattern area W1 of the conductive connecting member 3 before bonding, such that the pattern area W2 is within the pixel electrode 14 after bonding. In an actual operation, the pattern area of the conductive connecting member 3 is controlled so as to vary by two times or less during the bonding operation, so that a defect caused by leak can be effectively prevented. For this reason, the height H1 of the space keeping member 45 and the height H2 of the conductive connecting member 3 are preferably set so as to satisfy 2×H1≧H2.

Upon performing a thermocompression bonding (FIG. 6(d) and FIG. 10(d)) in the bonding process of the present manufacturing method, the space keeping members 45 are preferably less prone to deformation than the conductive connecting members 3. This is because the conductive connecting members 3 is softened to a degree so as to improve the adhesion; meanwhile, when the space keeping members 45 are less prone to deformation, the more space keeping ability is obtained.

Additionally, in the aligning step shown in FIGS. 6(c) and FIG. 10(c), it is also possible to allow the bonding surfaces of the substrates 1 and 2 to oppose each other such that the pixels of the substrates 1 and 2 correspond to each other. In this case, it is preferable to correct a shift between the substrates so as to keep the conductive connecting members 3 and the space keeping members 45 from overlapping each other.

Further, the photosensitive resin sheet 101 of FIG. 11(a) is preferably provided with at least the thermoplastic resin layer 103 and the photosensitive resin layer 102 on the supporting film 104. Furthermore, the bonding step of the photosensitive resin sheet 101, that is described in FIG. 11(a), can be also described as a bonding step for bonding the photosensitive resin sheet 101 onto the active-matrix substrate 1.

Moreover, as for the present image detecting device manufactured in the present manufacturing method, even when the substrates 1 and 2 are strongly pressed and bonded to each other during the bonding step, the space keeping members 45 maintain the space between the substrates at a certain value, so that the space(gap) between the substrates never becomes smaller than a predetermined value.

Therefore, even when the present image detecting device is provided with large substrates (for example, substrate size of about 400 nm×500 nm or larger), it is possible to bond the substrates in a state in which the gap is evenly maintained between the substrates. As a result, a connection can be secured with favorable yield. Furthermore, the space keeping members 45 are provided, so that the conductive connecting members 3 are not deformed too much; consequently, it is possible to prevent the adjacent conductive connecting members 3 from being contact with each other(defect caused by leak).

Additionally, the present invention can be also represented as a first two-dimensional image detecting device and first and second manufacturing methods of the two-dimensional image detecting device.

Namely, a first two-dimensional image detecting device, which is provided with (a) an active-matrix substrate including a pixel alignment layer having electrode wires aligned in a lattice form, a plurality of switching elements respectively disposed at the intersections, and pixel electrodes connected with the electrode wires via the switching elements, and (b) an opposing substrate including electrode sections formed so as to oppose virtually the entire surface of the pixel alignment layer, and a semiconductive layer with photoconductivity formed between the pixel alignment layer and the electrode sections, the first two-dimensional image detecting device having a construction in which the substrates are arranged such that the pixel alignment layer of the active-matrix substrate and the semiconductive layer of the opposing substrate oppose each other, the substrates are connected with each other via conductive connecting members formed by patterning with conductivity and adhesion in accordance with the pixel electrodes, and space keeping members are formed by patterning between the substrates so as to maintain a space between the substrates.

With this arrangement, the active-matrix substrate including the pixel alignment layer and the opposing substrate including the electrode sections and the semiconductive layer are connected with each other via the conductive connecting members, which have conductivity and adhesion and are patterned in accordance with the pixel electrodes; thus, the active-matrix substrate and the opposing substrate can be separately formed.

In the conventional art, a semiconductive layer is formed on a substrate where a pixel alignment layer has been formed; thus, upon forming the semiconductive layer, it is not possible to use semiconductive materials requiring a heating operation which adversely affects switching elements of the pixel alignment layer. However, the above-mentioned arrangement makes it possible to separately form an active-matrix substrate and an opposing substrate, so that it is possible to use materials, which has not been allowed in the conventional art, for the semiconductive layer.

Further, as the available semiconductive materials in the above-mentioned arrangement, for example, it is possible to adopt a CdTe or CdZnTe compound semiconductor. These semiconductive materials have higher sensitivity to a radiation such as X-ray(S/N ratio) than conventionally used a-Se; thus, a CdTe or CdZnTe compound semiconductor is used for the semiconductive layer so as to improve the responsivity of the two-dimensional image detecting device.

Furthermore, in this case, voltage applied to the electrode sections can be set lower than that of the conventional art, so that it is possible to omit a dielectric layer, which has been disposed between the semiconductive layer and the electrode sections of the conventional art in order to provide a protection against a high voltage. Hence, the conventional construction, namely, a construction, which has the dielectric layer disposed between the semiconductive layer and the electrode sections, requires a step (sequence) for removing electrical charge remained in the dielectric layer, for each frame; therefore, the conventional two-dimensional image detecting device can detect merely a static image. However, the dielectric layer is omitted so as to detect a moving image.

Moreover, the active-matrix substrate and the opposing substrate are connected with each other via the conductive connecting members which are patterned in accordance with the pixel electrodes; thus, it is possible to secure electrical insulation for each pixel of the active-matrix substrate, and to electrically and physically connect the pixel electrodes of the active-matrix substrate and the semiconductive layer of the opposing substrate without causing crosstalk between the adjacent pixels.

Additionally, the space keeping members are disposed so as to keep the space (gap) between the substrates at a certain space or more, when the substrates are connected and bonded to each other by strongly pressing in such a manner as to cause no connecting defect. Therefore, the space between the substrates does not become smaller than a predetermined value, so that it is possible to prevent the adjacent conductive connecting members from being contact with each other (defect caused by leak).

Further, the pattern of the space keeping members is formed so that the space keeping members are disposed merely at portions having no conductive connecting member. Thus, the above-mentioned effect can be achieved without adversely affecting the conductivity and adhesion that are required for the conductive connecting members.

Furthermore, it is preferable to form the space keeping members in a lattice form surrounding the conductive connecting members. With this arrangement, when the patterns of the conductive connecting members and the space keeping members have poor accuracy, or when the conductive connecting members are pressed and deformed, even if the members are brought into contact with each other, the adjacent connecting members are separated by the space keeping members so as to prevent the conductive connecting members from being contact with on another (defect caused by leak).

Moreover, the space keeping members are preferably made of a material having electrical insulation with this arrangement, when the patterns of the conductive connecting members and the space keeping members have poor accuracy, or when the conductive connecting members are pressed and deformed, even if the members are brought into contact with each other, the insulating space keeping members are disposed between the adjacent conductive connecting members so as to more positively prevent electrical leak.

Additionally, the space keeping members are preferably formed so as to have higher hardness than the conductive connecting members, under a thermocompression bonding in the connecting step of the conductive connecting members. With this arrangement, when the active-matrix substrate and the opposing substrate are bonded to and connected with each other by a thermocompression bonding, even at a temperature where the conductive connecting members are slightly softened, the space keeping members can offer sufficient space keeping ability.

Further, the space keeping members are preferably made of a resin material having photosensitivity. Hence, it is possible to set high patterning accuracy for the space keeping members.

Moreover, as a resin material constituting the space keeping member, it is preferable to adopt a polyimide polymeric material. This arrangement can achieve the space keeping members which has superior characteristics of electrical insulation, a softening point of 300° C. or more, and stability to a radiation.

Furthermore, the space keeping members can be made by mixing reinforcing members or fillers, that has electrical insulation, with a resin material having electrical insulation. With this arrangement, even when the resin material of the space keeping members is soft, the reinforcing members or fillers, that have electrical insulation, are placed therein so as to offer sufficient space keeping ability.

Moreover, the space keeping members can be made by mixing reinforcing members with a liquid resin material having electrical insulation. The reinforcing members have electrical insulation and hardly become deformed under a thermocompression bonding in the connecting step of the conductive connecting members. This arrangement can also sufficiently improve the space keeping ability of the space keeping members.

Further, a first manufacturing method of the two-dimensional image detecting device, the two-dimensional image detecting device being provided with (a) an active-matrix substrate including a pixel alignment layer having electrode wires aligned in a lattice form, a plurality of switching elements respectively disposed at the intersections, and pixel electrodes connected with the electrode wires via the switching elements, and (b) an opposing substrate including electrode sections formed so as to oppose virtually the entire surface of the pixel alignment layer, and a semiconductive layer with photoconductivity formed between the pixel alignment layer and the electrode sections, the method including a first step for forming a pattern of conductive connecting members, which have conductivity and adhesion, in accordance with the pixel electrodes on either the active-matrix substrate or the opposing substrate, a second step for forming a pattern of the space keeping members, which have electrical insulation and keep a space (gap) between the substrates, so as to surround the conductive connecting members in a lattice form on the other substrate, a third step for arranging the substrates such that the pixel alignment layer of the active-matrix substrate and the semiconductive layer of the opposing substrate oppose each other, and a fourth step for connecting and bonding the substrates via the conductive connecting members.

With this method, unlike the conventional art, it is not necessary to form another semiconductive layer on the substrate where the pixel alignment layer has been already formed. For this reason, in the conventional art, it has not been possible to use a semiconductive material which requires a heating operation adversely affecting the switching elements of the pixel alignment layer upon forming the semiconductive layer. Meanwhile, in this method, the active-matrix substrate and the opposing substrate are separately formed so as to use a material which has not been used, for example, a CdTe or CdZnTe compound semiconductor, for the semiconductive layer.

Such a semiconductive material has higher sensitivity to a radiation such as an X-ray (S/N ratio) as compared with conventional a-Se; thus, a CdTe or CdZn compound semiconductor is used for the semiconductive layer so as to improve the responsivity of the two-dimensional image detecting device and to detect a moving image.

Moreover, the active-matrix substrate and the opposing substrate are connected with each other via the conductive connecting members which are patterned in accordance with the pixel electrodes; thus, it is possible to secure electrical insulation for each pixel of the active-matrix substrate, and to electrically and physically connect the pixel electrodes of the active-matrix substrate and the semiconductive layer of the opposing substrate without causing crosstalk between the adjacent pixels.

Additionally, the space keeping members are disposed so as to keep the space (gap) between the substrates at a certain space or more, when the substrates are connected and bonded to each other by strongly pressing in such a manner as to cause no connecting defect. Therefore, the space between the substrates does not become smaller than a predetermined value, so that it is possible to prevent the adjacent conductive connecting members from being contact with each other (defect caused by leak).

Further, the pattern of the space keeping members is formed such that the space keeping members are disposed merely at portions having no conductive connecting member. Thus, the above-mentioned effect can be achieved without adversely affecting the conductivity and adhesion that are required for the conductive connecting members.

Furthermore, the conductive connecting members and the space keeping members are formed on the different substrates, so that it is possible to readily form the patterns of the respective materials. Here, it is possible to form the patterns of the conductive connecting members and the space keeping members on any one of the substrates. However, the previously formed pattern interferes with the following pattern formation. In this case, it is necessary to put some thought into the used materials and the process.

Additionally, a second manufacturing method of the two-dimensional image detecting device, the two-dimensional image detecting device being provided with (a) an active-matrix substrate including a pixel alignment layer having electrode wires aligned in a lattice form, a plurality of switching elements respectively disposed at the intersections, and pixel electrodes connected with the electrode wires via the switching elements, and (b) an opposing substrate including electrode sections formed so as to oppose virtually the entire surface of the pixel alignment layer, and a semiconductive layer with photoconductivity formed between the pixel alignment layer and the electrode sections, the method including a first step for forming the pattern of space keeping members which have electrical insulation and keep a space (gap) between the substrates, and the pattern of conductive connecting members which have conductivity and adhesion in accordance with the pixel electrodes on either the active-matrix substrate or the opposing substrate, a second step for arranging the substrates such that the pixel alignment layer of the active-matrix substrate and the semiconductive layer of the opposing substrate oppose each other, and a third step for bonding the substrates via the conductive connecting members.

With this method, unlike the conventional art, it is not necessary to form another semiconductive layer on the substrate where the pixel alignment layer has been already formed. For this reason, in the conventional art, it has not been possible to use a semiconductive material which requires a heating operation adversely affecting the switching elements of the pixel alignment layer upon forming the semiconductive layer. Meanwhile, in this method, the active-matrix substrate and the opposing substrate are separately formed so as to use a material which has not been used, for example, a CdTe and CdZnTe compound semiconductor, for the semiconductive layer.

Such a semiconductive material has higher sensitivity to a radiation such as an X-ray(S/N ratio) as compared with conventional a-Se; thus, a CdTe or CdZn compound semiconductor is used for the semiconductive layer so as to improve the responsivity of the two-dimensional image detecting device and to detect a moving image.

Moreover, the active-matrix substrate and the opposing substrate are connected with each other via the conductive connecting members which are patterned in accordance with the pixel electrodes; thus, it is possible to secure electrical insulation for each pixel of the active-matrix substrate, and to electrically and physically connect the pixel electrodes of the active-matrix substrate and the semiconductive layer of the opposing substrate without causing crosstalk between the adjacent pixels.

Additionally, the space keeping members are disposed so as to keep the space (gap) between the substrates at a certain space or more, when the substrates are connected and bonded to each other by strongly pressing in such a manner as to cause no connecting defect. Therefore, the space between the substrates does not become smaller than a predetermined value, so that it is possible to prevent the adjacent conductive connecting members from being contact with each other (defect caused by leak).

Further, the pattern of the space keeping members is formed such that the space keeping members are disposed merely at portions having no conductive connecting member. Thus, the above-mentioned effect can be achieved without adversely affecting the conductivity and adhesion that are required for the conductive connecting members.

Furthermore, the conductive connecting members and the space keeping members are formed on the same substrate, so that it is possible to form the conductive connecting members and the space keeping members on one of the active-matrix substrate and the opposing substrate, that is less prone to adverse effect of the pattern formation processes of the both members. Specifically, when the semiconductive layer formed on the opposing substrate changes the property because of the exposure to a solution (developing solution, etc.)required for the pattern formation processes of the conductive connecting members and the space keeping members, the patterns of the conductive connecting members and the space keeping members can be formed on the active-matrix substrate.

Additionally, when the patterns of the conductive connecting members and the space keeping members are formed on one of the substrates, the projections and depressions of the previously formed pattern interfere with the following pattern formation; thus, it is desirable to firstly form the pattern of the conductive connecting members or the space keeping members whose height is lower than the other upon completion of the pattern, and then to form the pattern of the other members. In this case, in order to form the pattern without being affected by the projections and depressions of the lower layer, it is necessary to specially put some thought into the material, which is formed later, and the process.

Moreover, regarding the first and second manufacturing methods of the two-dimensional image detecting device, it is preferable to form the pattern of at least one of the conductive connecting members and the space keeping members by using the bonding step for a photosensitive resin sheet and the photolithography step.

With this arrangement, even in the case of the large two-dimensional image detecting device, the bonding step for the photosensitive resin sheet makes it possible to readily form the conductive connecting members and the space keeping members with an even thickness. Additionally, through the use of a resin sheet, which is provided with a thermoplastic layer (cushion layer) disclosed in Japanese Laid-Open Patent Publication No.173320/1993 (Tokukaihei 5-173320, published on Jul. 13, 1993), as the photosensitive resin layer, it is possible to bond the photosensitive resin sheet while minimizing the chances of catching air bubbles, even when projections and depressions exist on the substrate surface to be bonded.

In the case of the second manufacturing method of the two-dimensional image detecting device, the patterns of the conductive connecting members and the space keeping members are formed on the same substrate, so that projections and depressions of the previously formed pattern may interfere with the following pattern formation. In this case, the photosensitive resin sheet, which is provided with the thermoplastic resin layer (cushion layer), is used as the material formed into the pattern later, and the patterns are formed through the bonding step and the photolithography step. Hence, even when projections and depressions exist on the substrate surface to be bonded, it is possible to bond the photosensitive resin sheet while minimizing the chances of catching air bubbles.

Further, according to the first and second manufacturing methods of the two-dimensional image detecting device, prior to the bonding of the active-matrix substrate and the opposing substrate, it is preferable to form the patterns such that the conductive connecting members are higher than the space keeping members.

Upon bonding the active-matrix substrate and the opposing substrate, this arrangement makes it possible to press the substrates until the space between the substrates becomes equal to the height of the space keeping members. Therefore, the conductive connecting members are pressed and deformed, and the height is reduced by a difference between the height of the conductive connecting members and the height of the space keeping members, so that the conductive connecting members can be completely bonded to the substrates. Hence, it is possible to positively obtain conductive connections.

As described above, the present image detecting device is provided with the active-matrix substrate including (a)the pixel alignment layer having the electrode wires arranged in a lattice form, a plurality of the switching elements respectively disposed at the intersections, and the pixel electrodes connected with the electrode wires via the switching elements, (b)the electrode sections formed so as to oppose virtually the entire surface of the pixel alignment layer, and (c)the semiconductive layer with photoconductivity being formed between the pixel alignment layer and the electrode sections; and the opposing substrate including the electrode section and the semiconductive section, wherein the substrates are disposed such that the pixel alignment layer of the active-matrix substrate and the semiconductive layer of the opposing substrate oppose each other, the substrates are connected with each other via the conductive connecting members having conductivity and adhesion, that are patterned in accordance with the pixel electrodes, and the patterned space keeping members are disposed in a space between the active-matrix substrate and the opposing substrate.

As described above, the space keeping members can keep the space (gap) between the substrates at a certain space or more, even when the substrates are connected and bonded to each other by strongly pressing in such a manner as to cause no connecting defect. Therefore, the space between the substrates does not become smaller than a predetermined value, so that it is possible to prevent the adjacent conductive connecting members from being contact with each other (defect caused by leak).

Further, the pattern of the space keeping members is formed such that the space keeping members are disposed merely at portions having no conductive connecting member. Thus, the above-mentioned effect can be achieved without adversely affecting the conductivity and adhesion that are required for the conductive connecting members.

Furthermore, in the present image detecting device, the space keeping members are made of an insulating material.

As described above, through the use of the space keeping members made of an insulating material, when the pattern of the conductive connecting members and the pattern of the space keeping members have poor accuracy, or when the conductive connecting members are pressed and deformed, even if the members come into contact with each other, the insulating space keeping members are disposed between the adjacent conductive connecting members so as to more positively prevent electrical leak.

Moreover, regarding the present image detecting device, the height H1 of the space keeping members and the height H2 of the conductive connecting members are set so as to satisfy $2 \times H1 \geq H2 \geq H1$ before the active-matrix substrate and the opposing substrate are bonded to each other.

As described above, the heights of the conductive connecting members and the space keeping members are set so as to satisfy $H2 \geq H1$, so that upon bonding the active-matrix substrate and the opposing substrate, this arrangement makes it possible to press the substrates until the space between the substrates becomes equal to the height of the space keeping members. Therefore, the conductive connecting members are pressed and slightly deformed, and the height is reduced by a height difference $\Delta H(=H2-H1)$ between the conductive connecting members and the space keeping members, so that the conductive connecting members can be completely bonded to the substrates. Hence, it is possible to positively obtain conductive connections.

Additionally, the heights of the conductive connecting members and the space keeping members are set so as to satisfy $2 \times H2 \geq H1$, so that an increase in an area of the conductive member can be regulated to two times or less during the bonding of the active-matrix substrate and the opposing substrate. Hence, it is possible to positively prevent a leak to a neighboring pixel, that is caused by a contact between the adjacent conductive connecting members.

Further, in the present image detecting device, the space keeping members are formed in a lattice form so as to surround the conductive connecting members which are formed by patterning in accordance with the pixel electrodes.

As described above, the space keeping members are disposed so as to surround the conductive members; thus, when the patterns of the conductive connecting members and the space keeping members have poor accuracy, or when the conductive connecting members are pressed and deformed, even if the members come into contact with each other, the adjacent connecting members are separated by the space keeping members so as to prevent an electrical leak.

Furthermore, it is also possible to mix insulating particles or fiber (fibrous state and fibrous piece) reinforcing members into a liquid resin material, as a material of the space keeping members.

With this arrangement, even when the resin of the space keeping members is made of a soft resin material, insulating particles and fiber pieces are dispersed therein, so that it is possible to sufficiently offer space keeping ability.

Moreover, regarding the present image detecting device, in the connecting process in which the conductive connecting members are subjected to a thermocompression bonding, the hardness of the space keeping members is set higher than that of the conductive connecting members.

The hardness of the conductive connecting members and the space keeping members are set as described above in the thermocompression bonding of the conductive connecting members, so that when the active-matrix substrate and the opposing substrate are bonded and connected with each other by a thermocompression bonding, the space keeping members can offer sufficient space keeping ability even at a temperature which can slightly soften the conductive connecting members.

Additionally, in the present image detecting device, the space keeping members are made of a polyimide polymeric material.

The polyimide polymeric material has superior characteristics of electrical insulation, a softening point at 300° C. or more, and stability to a radiation. Thus, it is possible to preferably use the polyimide polymeric material as the space keeping members.

Further, the present manufacturing method forms the pattern of the conductive connecting members either on the active-matrix substrate or the opposing substrate, and bonds and connects the substrates after the space keeping members have been patterned and disposed on the other substrate.

As described above, the conductive connecting members and the space keeping members are separately formed on the different substrates, so that it is possible to readily form the patterns of the individual materials. Here, the patterns of the conductive connecting members and the space keeping members can be formed on any one of the substrates; however, the previously formed pattern interferes with the following pattern formation, so that in this case, it is necessary to put some thought into the used material and the process.

Further, as a conductive conductive adhesive, which is used as a material for the conductive connecting member 3 and has a thermosetting or photocuring property, it is possible to adopt a material obtained by adding a conductive pigment into a heat polymerizing or photopolymerizing adhesive such as acrylic or epoxy.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-dimensional image detecting device, which has a pixel substrate including a plurality of pixels, and an opposing substrate including a photoconductive layer for generating electrical charge in response to incident light, the two-dimensional image detecting device comprising:
   conductive connecting members which are disposed so as to correspond to pixels and which electrically connect pixel electrodes of said pixel substrate and said photoconductive layer,
   at least one space keeping member for keeping a space between the substrates, wherein said at least one space keeping member is arranged in lattice form, and
   wherein said space keeping member in lattice form surrounds said conductive connecting members.

2. The two-dimensional image detecting device as defined in claim 1, wherein said space keeping member has electrical insulation.

3. The two-dimensional image detecting device as defined in claim 1, wherein said space keeping member has higher hardness than said conductive connecting member.

4. The two-dimensional image detecting device as defined in claim 1, wherein each of said conductive connecting member and said space keeping member has a height between 5 $\mu$m and 30 $\mu$m.

5. The two-dimensional image detecting device as defined in claim 1, wherein said conductive connecting member is made of a material which is softened so as to have adhesion.

6. The two-dimensional image detecting device as defined in claim 5, wherein said space keeping member has a softening temperature which is higher than said conductive connecting member.

7. The two-dimensional image detecting device as defined in claim 1, wherein said space keeping member comprises an epoxy, acrylic, or urethane polymeric material.

8. The two-dimensional image detecting device as defined in claim 1, wherein said conductive connecting member comprises a thermosetting or photo-curing adhesive.

9. The two-dimensional image detecting device as defined in claim 1, wherein said photoconductive layer comprises a polycrystal film comprising a material selected from the group consisting of CdTe and CdZnTe.

10. The two-dimensional image detecting device as defined in claim 1, wherein said photoconductive layer exhibits photoconductivity to a radiation, a visible light, and an infrared radiation.

11. The two-dimensional image detecting device as defined in claim 1, wherein a plurality of said pixels are disposed in a lattice form on said pixel substrate, each of said pixels includes a storage capacitor for accumulating electrical charge generated from said photoconductive layer, and a switching element for taking out electrical charge accumulated in said storage capacitor and said switching element is connected to an electrode wire for outputting electrical charge to outside.

12. The two-dimensional image detecting device as defined in claim 11, wherein said switching element is a TFT element.

13. A two-dimensional image detecting device, which has a pixel substrate including a plurality of pixels, and an opposing substrate including a photoconductive layer for generating electrical charge in response to incident light, the two-dimensional image detecting device comprising:
   conductive connecting members which are disposed so as to correspond to pixels and which electrically connect pixel electrodes of said pixel substrate and said photoconductive layer,
   at least one space keeping member for keeping a space between the substrates, wherein said at least one space keeping member is arranged in lattice form, and
   wherein said space keeping member is made of a resin material having photosensitivity.

14. A two-dimensional image detecting device, which has a pixel substrate including a plurality of pixels, and an opposing substrate including a photoconductive layer for generating electrical charge in response to incident light, the two-dimensional image detecting device comprising:
   conductive connecting members which are disposed so as to correspond to pixels and which electrically connect pixel electrodes of said pixel substrate and said photoconductive layer,
   at least one space keeping member for keeping a space between the substrates, wherein said at least one space keeping member is arranged in lattice form, and
   wherein said space keeping member is formed by mixing a reinforcing member or a filler, which has electrical insulation, into a resin material having electrical insulation.

15. A two-dimensional image detecting device, which has a pixel substrate including a plurality of pixels, and an opposing substrate including a photoconductive layer for generating electrical charge in response to incident light, the two-dimensional image detecting device comprising:
conductive connecting members which are disposed so as to correspond to pixels and which electrically connect pixel electrodes of said pixel substrate and said photoconductive layer,
at least one space keeping member for keeping a space between the substrates, wherein said at least one space keeping member is arranged in lattice form, and
wherein said space keeping member comprises a polyimide polymeric material having photosensitivity.

16. A two-dimensional image detecting device, which has a pixel substrate including a plurality of pixels, and an opposing substrate including a photoconductive layer for generating electrical charge in response to incident light, the two-dimensional image detecting device comprising:
conductive connecting members which are disposed so as to correspond to pixels and which electrically connect pixel electrodes of said pixel substrate and said photoconductive layer,
at least one space keeping member for keeping a space between the substrates, wherein said at least one space keeping member is arranged in lattice form, and
wherein said space keeping member comprises $SiO_2$.

17. A two-dimensional image detecting device comprising:
an active-matrix substrate including electrode wires arranged in a lattice form, a plurality of switching elements respectively disposed proximate intersections of said lattice form, and pixel electrodes electrically connected to said switching elements, and
an opposing substrate including electrode sections formed so as to oppose said pixel electrodes, and a semiconductive layer with photoconductivity formed between said pixel electrodes and said electrode sections,
wherein said substrates are connected to each other via conductive connecting members, which are formed by patterning in accordance with said pixel electrodes, with conductivity and adhesion, and insulating photosensitive space keeping members formed by patterning so as to keep a space between said substrates.

18. The two-dimensional image detecting device as defined in claim 17, wherein said space keeping members are made into a lattice form so as to surround said conductive connecting members.

19. The two-dimensional image detecting device as defined in claim 17, wherein said space keeping members are made of a material having electrical insulation.

20. The two-dimensional image detecting device as defined in claim 17, wherein said space keeping members have higher hardness than said conductive connecting members under a thermocompression bonding condition in a connecting step for said conductive connecting members.

21. The two-dimensional image detecting device as defined in claim 17, wherein said space keeping members are obtained by mixing a reinforcing member or a filler, which has electrical insulation, into a resin material having electrical insulation.

22. The device of claim 17, wherein at least some of said insulating space keeping members have a thickness greater than a thickness(s) of said conductive connecting members and are not contacting any of the pixel electrodes.

23. A manufacturing method for a two-dimensional image detecting device, said device comprising a pixel substrate being provided with a pixel alignment layer having a plurality of pixels in which pixel electrodes are in communication with switching TFTs, and an opposing substrate being provided with a photoconductive layer for generating electrical charge in response to incident light, said method comprising the steps of:
a connecting member forming step for forming conductive connecting members on one of said substrates in accordance with the pixels of said pixel alignment layer, so that at least one of the conductive connecting members is disposed between and electrically connects one of the pixel electrodes to the photoconductive layer and is spaced apart from and does not contact any gate of any TFT;
a keeping member forming step for forming space keeping members, which keep a space between said substrates, on one of said substrates, and
a connecting step for bonding said substrates such that said pixel alignment layer and said photoconductive layer oppose each other.

24. The manufacturing method for the two-dimensional image detecting device as defined in claim 23, wherein an insulating material is adopted for said space keeping members.

25. The manufacturing method for the two-dimensional image detecting device as defined in claim 24, wherein in said connecting member forming step, said conductive connecting members are formed on one of said substrates, and
in said keeping member forming step, said space keeping members are formed on the other substrate.

26. The manufacturing method for the two-dimensional image detecting device as defined in claim 24, wherein in said connecting member forming step, a photosensitive resin layer with conductivity is formed on said substrate, and then, the layer is exposed and developed so as to form a pattern of said conductive connecting members.

27. The manufacturing method for the two-dimensional image detecting device as defined in claim 24, wherein in said connecting member forming step, a conductive resin is electrodeposited onto said substrate so as to form a pattern of said conductive connecting members.

28. The manufacturing method for the two-dimensional image detecting device as defined in claim 24, wherein in said connecting member forming step, a conductive adhesive is printed onto said substrate so as to form a pattern of said conductive connecting members.

29. The manufacturing method for the two-dimensional image detecting device as defined in claim 28, wherein said conductive adhesive is printed in accordance with an ink jet method.

30. The manufacturing method for the two-dimensional image detecting device as defined in claim 28, wherein said conductive adhesive is printed in accordance with a screen printing.

31. The manufacturing method for the two-dimensional image detecting device as defined in claim 30, wherein said screen printing is performed by using an Ni metal mask.

32. The manufacturing method for the two-dimensional image detecting device as defined in claim 31, wherein regarding said screen printing, an epoxy adhesive paste having an Ag conductive particle is used as a material for said conductive connecting member.

33. The manufacturing method for the two-dimensional image detecting device as defined in claim 24, wherein in said keeping member forming step, an insulating photosensitive resin layer is formed on said substrate, and the layer is exposed and developed so as to form a pattern of said space keeping members.

34. The manufacturing method for the two-dimensional image detecting device as defined in claim 24, wherein in said keeping member forming step, an insulating layer made of an insulating material is formed on said substrate, a photosensitive photoresist is formed thereon, and then, the layers are subjected to exposing, developing and etching operations so as to form a pattern of said space keeping members.

35. The manufacturing method for the two-dimensional image detecting device as defined in claim 24, wherein in said keeping member forming step, an insulating paste is printed on said substrate so as to form a pattern of said space keeping members.

36. The manufacturing method for the two-dimensional image detecting device as defined in claim 35, wherein said insulating paste is printed in accordance with an ink jet method.

37. The manufacturing method for the two-dimensional image detecting device as defined in claim 35, wherein said insulating paste is printed in accordance with a screen printing.

38. The manufacturing method for the two-dimensional image detecting device as defined in claim 24, wherein in said keeping member connecting step and said connecting member forming step, when said space keeping member and said conductive connecting member respectively have heights of H1 and H2, said space keeping members and said conductive connecting members are formed so as to satisfy $H1 \leq H2$.

39. The manufacturing method for the two-dimensional image detecting device as defined in claim 38, wherein in said keeping member connecting step and said connecting member forming step, said space keeping members and said conductive connecting members are formed such that H1 and H2 satisfy $2 \times H1 \geq H2 \geq H1$.

40. The manufacturing method for the two-dimensional image detecting device as defined in claim 38, wherein in said connecting step, said conductive connecting members are softened by a thermocompression bonding and are pressed and deformed between said substrates.

41. The manufacturing method for the two-dimensional image detecting device as defined in claim 40, wherein a material, which exhibits higher hardness than said conductive connecting member in said thermocompression bonding, is used as a material for said space keeping members.

42. The manufacturing method for the two-dimensional image detecting device as defined in claim 24, wherein in said connecting member forming step, said conductive connecting members are independently formed into island shapes on said pixels, and
in said keeping member forming step, said space keeping members are formed so as to surround each of the pixels.

43. The manufacturing method for the two-dimensional image detecting device as defined in claim 42, wherein said connecting step is performed under a reduced pressure condition.

44. The manufacturing method for the two-dimensional image detecting device as defined in claim 42, wherein in said keeping member forming step, said space keeping members are disposed at a circumference of said substrates as well.

45. The manufacturing method for the two-dimensional image detecting device as defined in claim 24, wherein a thermosetting or photo-curing adhesive is used as a material for said conductive connecting member.

46. The manufacturing method for the two-dimensional image detecting device as defined in claim 24, wherein a material, which is softened so as to have adhesion, is used as a material for said conductive connecting member.

47. The manufacturing method for the two-dimensional image detecting device as defined in claim 46, wherein a material, which has a higher softening temperature than said conductive connecting member, is used as a material for said space keeping members.

48. The manufacturing method for the two-dimensional image detecting device as defined in claim 24, wherein a photosensitive polyimide polymeric material is used as a material for said space keeping members.

49. The manufacturing method for the two-dimensional image detecting device as defined in claim 24, wherein an epoxy, acrylic, or urethane polymeric material is used as a material for said space keeping members.

50. The manufacturing method for the two-dimensional image detecting device as defined in claim 24, wherein $SiO_2$ is used as a material for said space keeping members.

51. The manufacturing method for the two-dimensional image detecting device as defined in claim 24, wherein a material having adhesion and a bonding property is used as a material for said space keeping members.

52. The manufacturing method for the two-dimensional image detecting device as defined in claim 24, wherein a material, which is obtained by mixing either a reinforcing member or a filler into a resin material, is used as a material for said space keeping members.

53. The manufacturing method for the two-dimensional image detecting device as defined in claim 52, wherein a glass, ceramic, or plastic material is used as a material for said reinforcing member and said filler.

54. The manufacturing method for the two-dimensional image detecting device as defined in claim 24, wherein in said connecting member forming step and said keeping member forming step, said conductive connecting members and said space keeping members are formed on one of said substrates.

55. The manufacturing method for the two-dimensional image detecting device as defined in claim 54, wherein steps performed later in said connecting member forming step and said keeping member forming step include:
a bonding step in which a bonding sheet, which is constituted by a photosensitive resin layer and a thermoplastic resin layer, is bonded onto said substrate while performing a heating operation, the photosensitive resin layer being disposed lower, and
a photolithography step in which the bonding sheet is exposed and developed so as to form a pattern of said conductive connecting members or said space keeping members.

56. The manufacturing method for the two-dimensional image detecting device as defined in claim 54, wherein in said connecting member forming step and said keeping member forming step, said conductive connecting members and said space keeping members are formed on said pixel substrate.

57. The manufacturing method for the two-dimensional image detecting device as defined in claim 54, wherein in said connecting member forming step and said keeping member forming step, the lower of said conductive connecting members and said space keeping members are firstly formed.

58. A manufacturing method of a two-dimensional image detecting device, said two-dimensional image detecting device comprising:

an active-matrix substrate including a pixel alignment layer having electrode wires aligned in a lattice form, a plurality of switching elements respectively disposed at intersections of said lattice form, and pixel electrodes connected with said electrode wires via said switching elements, and an opposing substrate including electrode sections formed so as to oppose virtually an entire surface of said pixel alignment layer, and a semiconductive layer with photoconductivity formed between said pixel alignment layer and said electrode sections, said method comprising the steps of:

a first step for forming a pattern of conductive connecting members, which have conductivity and adhesion, in accordance with said pixel electrodes on one of said substrates, a second step for forming a pattern of said space keeping members, which have electrical insulation and keep a space between said substrates, so as to surround said conductive connecting members in a lattice form on the other substrate, a third step for arranging said substrates such that said pixel alignment layer of said active-matrix substrate and said semiconductive layer of said opposing substrate oppose each other, and a fourth step for connecting and bonding said substrates via said conductive connecting members.

59. The manufacturing method for the two-dimensional image detecting device as defined in claim 58, wherein either said conductive connecting members or said space keeping members are formed by patterning in a bonding step and a photolithography step of a photosensitive resin sheet.

60. A manufacturing method of a two-dimensional image detecting device, said two-dimensional image detecting device comprising:

an active-matrix substrate including a pixel alignment layer having electrode wires aligned in a lattice form, a plurality of switching elements respectively disposed at intersections of said lattice form, and pixel electrodes connected with said electrode wires via said switching elements, and an opposing substrate including electrode sections formed so as to oppose virtually an entire surface of said pixel alignment layer, and a semiconductive layer with photoconductivity formed between said pixel alignment layer and said electrode sections, said method comprising the steps of:

a first step for forming a pattern of conductive connecting members, which have conductivity and adhesion, in accordance with said pixel electrodes on one of said substrates, a second step for forming a pattern of said space keeping members, which have electrical insulation and keep a space between said substrates, so as to surround said conductive connecting members in a lattice form on the other substrate, a third step for arranging said substrates such that said pixel alignment layer of said active-matrix substrate and said semiconductive layer of said opposing substrate oppose each other, a fourth step for connecting and bonding said substrates via said conductive connecting members, and wherein said conductive connecting members and said space keeping members are formed into patterns such that said conductive connecting members are higher than said space keeping members before bonding said active-matrix substrate and said opposing substrate.

61. A manufacturing method of a two-dimensional image detecting device, said two-dimensional image detecting device comprising:

an active-matrix substrate including a pixel alignment layer having electrode wires aligned in a lattice form, a plurality of switching elements respectively disposed at intersections, and pixel electrodes connected with said electrode wires via said switching elements, and an opposing substrate including electrode sections formed so as to oppose virtually an entire surface of said pixel alignment layer, and a semiconductive layer with photoconductivity formed between said pixel alignment layer and said electrode sections, said method comprising the steps of:

a first step for forming a pattern of space keeping members which have electrical insulation and keep a space between said substrates, and a pattern of conductive connecting members, which have conductivity and adhesion, in accordance with said pixel electrodes on either said active-matrix substrate or said opposing substrate, a second step for arranging said substrates such that said pixel alignment layer of said active-matrix substrate and said semiconductive layer of said opposing substrate oppose each other, a third step for bonding said substrates via said conductive connecting members; and wherein at least one of said conductive connecting members and said space keeping members are formed by patterning in a bonding step and a photolithography step of a photosensitive resin sheet.

62. The manufacturing method for the two-dimensional image detecting device as defined in claim 61, wherein said conductive connecting members and said space keeping members are formed into patterns such that said conductive connecting members are higher than said space keeping members before bonding said active-matrix substrate and said opposing substrate.

63. A two-dimensional image detecting device, which has an active substrate including a plurality of pixels, and an opposing substrate including a photoconductive layer for generating electrical charge in response to incident light, the two-dimensional image detecting device comprising:

conductive connecting members which are disposed so as to correspond to pixels and which electrically connect pixel electrodes of said active substrate to said photoconductive layer of said opposing substrate, and at least one space keeping member for keeping space between the substrates, wherein said at least one space keeping member comprises photosensitive material so that it may be patterned.

64. The image detecting device of claim 63, wherein the space keeping member is in a lattice form.

65. A two-dimensional image detecting device, which has an active substrate including a plurality of pixel electrodes and corresponding TFTs, and an opposing substrate including a photoconductive layer for generating electrical charge in response to incident light, the two-dimensional image detecting device comprising:

conductive connecting members which are disposed so as to correspond to pixels and which electrically connect pixel electrodes of said active substrate to said photoconductive layer of said opposing substrate, wherein said conductive connecting members are each spaced apart from and do not contact any TFT gate; and at least one space keeping member for keeping space between the substrates, wherein said at least one space keeping member comprises insulating material and is laterally spaced apart from pixel electrodes of said active substrate so that the space keeping member does not contact any of the pixel electrodes.

* * * * *